United States Patent
Murooka

(10) Patent No.: US 9,224,459 B1
(45) Date of Patent: Dec. 29, 2015

(54) MEMORY DEVICE AND METHOD OF INITIALIZING MEMORY DEVICE

(71) Applicant: KABUSHIKI KAISHA TOSHIBA, Minato-ku (JP)

(72) Inventor: Kenichi Murooka, San Jose, CA (US)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 216 days.

(21) Appl. No.: 14/017,727

(22) Filed: Sep. 4, 2013

Related U.S. Application Data

(60) Provisional application No. 61/822,583, filed on May 13, 2013.

(51) Int. Cl.
  *G11C 11/00* (2006.01)
  *G11C 13/00* (2006.01)

(52) U.S. Cl.
  CPC ........ *G11C 13/0002* (2013.01); *G11C 13/0004* (2013.01); *G11C 13/0069* (2013.01); *G11C 13/0007* (2013.01)

(58) Field of Classification Search
  CPC ........... G11C 13/0002; G11C 13/0069; G11C 13/0004; G11C 13/0007
  USPC ....................... 365/148, 51, 230.06
  See application file for complete search history.

(56) References Cited

U.S. PATENT DOCUMENTS

| 2011/0188281 A1* | 8/2011 | Siau et al. ........................ 365/51 |
| 2011/0235401 A1 | 9/2011 | Kunitake et al. |
| 2012/0147644 A1 | 6/2012 | Scheuerlein |

(Continued)

FOREIGN PATENT DOCUMENTS

| JP | 2011-198430 | 10/2011 |
| JP | 2011-204297 | 10/2011 |
| JP | 2012-79372 | 4/2012 |

OTHER PUBLICATIONS

U.S. Appl. No. 14/156,595, filed Jan. 16, 2014, Murooka.

(Continued)

*Primary Examiner* — Richard Elms
*Assistant Examiner* — Mohammed A Bashar
(74) *Attorney, Agent, or Firm* — Oblon, McClelland, Maier & Neustadt, L.L.P.

(57) ABSTRACT

According to one embodiment, a memory device includes a semiconductor layer connected between a first conductive line and one end of a third conductive line, resistance change elements connected between second conductive lines and the third conductive line respectively, a select FET having a select gate electrode, and using the semiconductor layer as a channel, and a control circuit changing a condition of initialization of each of non-completed elements in which the initialization is not completed among the resistance change elements based on a number of completed elements in which the initialization is completed among the resistance change elements.

19 Claims, 24 Drawing Sheets

(56) References Cited

U.S. PATENT DOCUMENTS

| | | |
|---|---|---|
| 2012/0147645 A1 | 6/2012 | Scheuerlein |
| 2012/0147646 A1 | 6/2012 | Scheuerlein |
| 2012/0147647 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa et al. |
| 2012/0147651 A1 | 6/2012 | Scheuerlein et al. |
| 2012/0147652 A1 | 6/2012 | Scheuerlein |
| 2012/0147689 A1 | 6/2012 | Scheuerlein et al. |
| 2013/0033929 A1* | 2/2013 | Kim .............................. 365/163 |
| 2013/0148400 A1 | 6/2013 | Murooka |
| 2013/0187118 A1 | 7/2013 | Murooka |

OTHER PUBLICATIONS

U.S. Appl. No. 14/593,254, filed Jan. 9, 2015, Murooka.
U.S. Appl. No. 14/593,344, filed Jan. 9, 2015, Murooka.
U.S. Appl. No. 14/284,516, filed May 22, 2014, Murooka.
U.S. Appl. No. 14/282,047, filed May 20, 2014, Murooka.
U.S. Appl. No. 14/025,146, filed Sep. 12, 2013, Murooka.

* cited by examiner

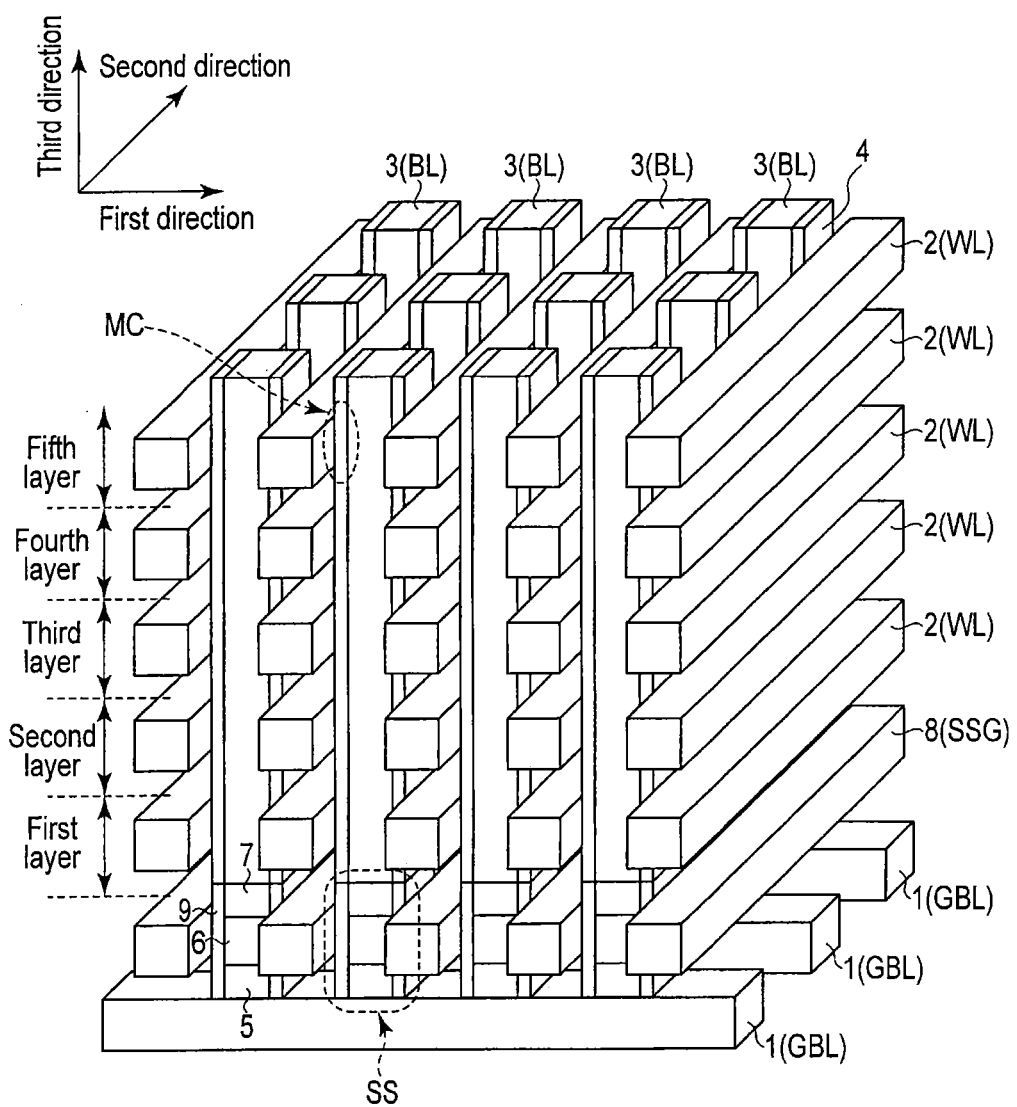
F I G. 1

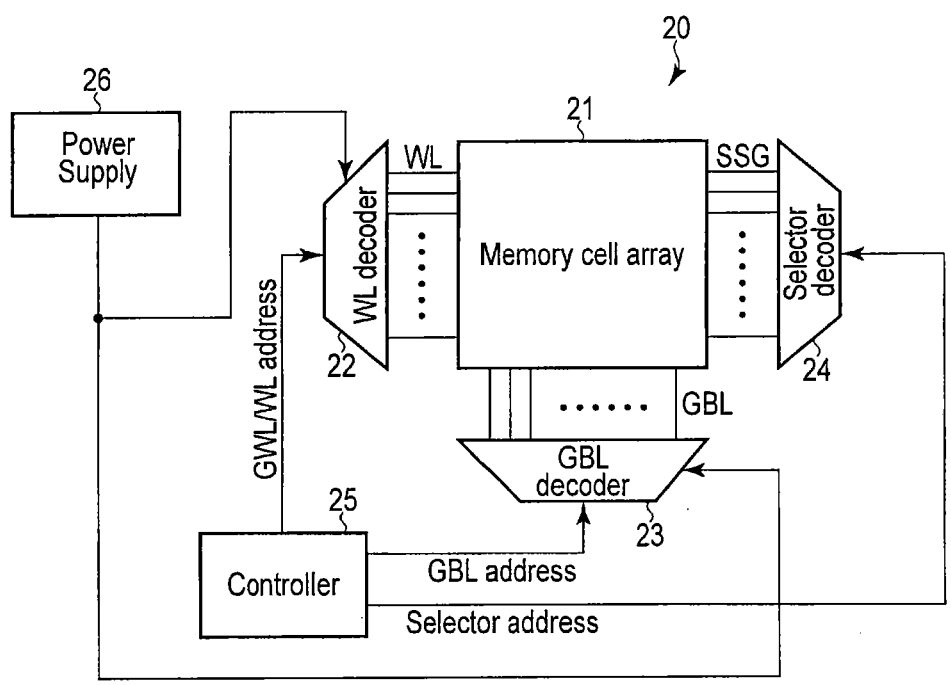
F I G. 4

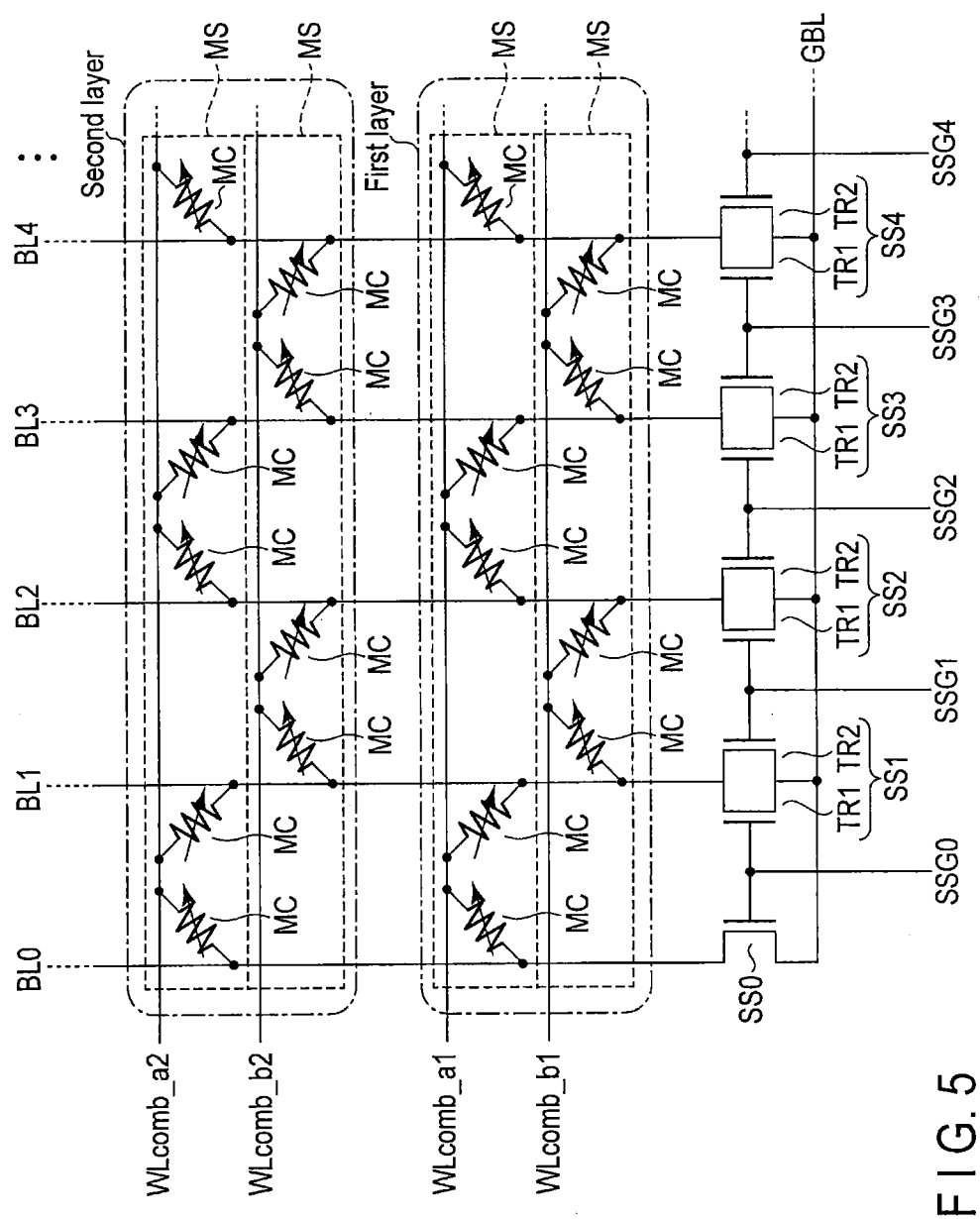
F I G. 5

|  | Write | Erase | Read | Forming |
|---|---|---|---|---|
| SSG_s | Vg_w | Vg_e | Vg_r,0 | Vg1_f |
| SSG_n | Vg_w | Vg_e | Vg_r,0 | Vg2_f |
| SSG_u | 0 | 0 | 0 | 0 |
| GBL_s | Vw | Vof | Vr+Vo | Vof |
| GBL_u | Vwf | Vef+Vof | Vr+Vo | Vff+Vof |
| WL_s | 0 | Ves+Vof | Vo | Vfs+Vof |
| WL_u | Vwf | Vef+Vof | Vr+Vo | Vff+Vof |

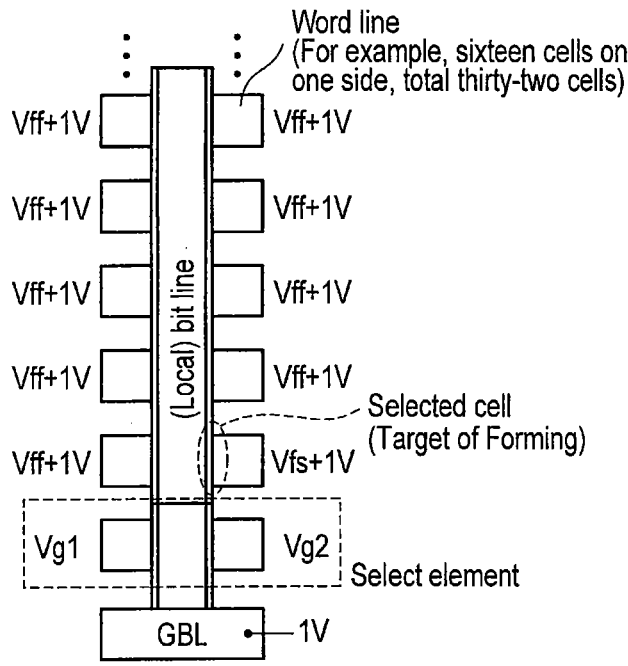
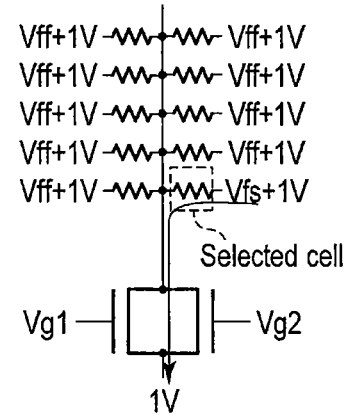
F I G. 9
F I G. 10
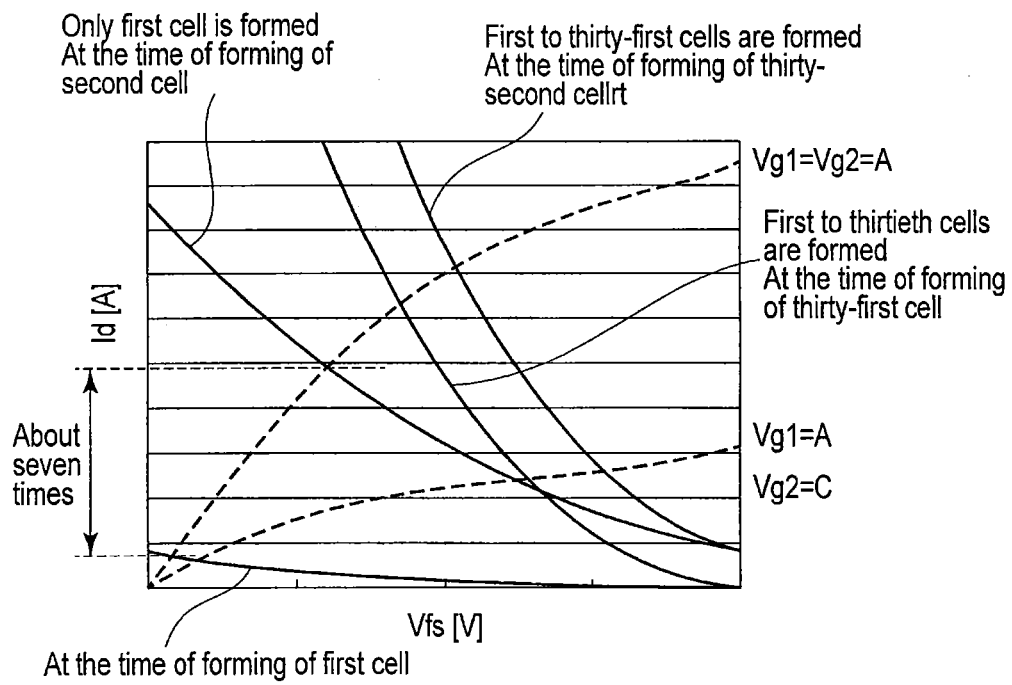
F I G. 11

| Number of initialized cells in one local bit line | Vg1 [V] | Vg2 [V] | Vfs [V] |
|---|---|---|---|
| 0 | A | C | a-1 |
| 1 | A | C | a-2 |
| 2 | A | D | b-1 |
| 3 | A | D | b-2 |
| 4 | A | D | b-3 |
| 5 | A | D | b-4 |
| 6 | A | D | b-5 |
| 7 | A | D | b-6 |
| 8 | A | D | b-7 |
| 9 | A | D | b-8 |
| 10 | A | D | b-9 |
| 11 | A | D | b-10 |
| 12 | A | D | b-11 |
| 13 | B | E | c-1 |
| 14 | B | E | c-2 |
| 15 | B | E | c-3 |
| 16 | B | E | c-4 |
| 17 | B | E | c-5 |
| 18 | B | E | c-6 |
| 19 | B | E | c-7 |
| 20 | B | E | c-8 |
| 21 | B | E | c-9 |
| 22 | B | E | c-10 |
| 23 | B | E | c-11 |
| 24 | B | E | c-12 |
| 25 | B | E | c-13 |
| 26 | B | E | c-14 |
| 27 | B | E | c-15 |
| 28 | B | E | c-16 |
| 29 | B | E | c-17 |
| 30 | B | E | c-18 |
| 31 | B | E | c-19 |

F I G. 13

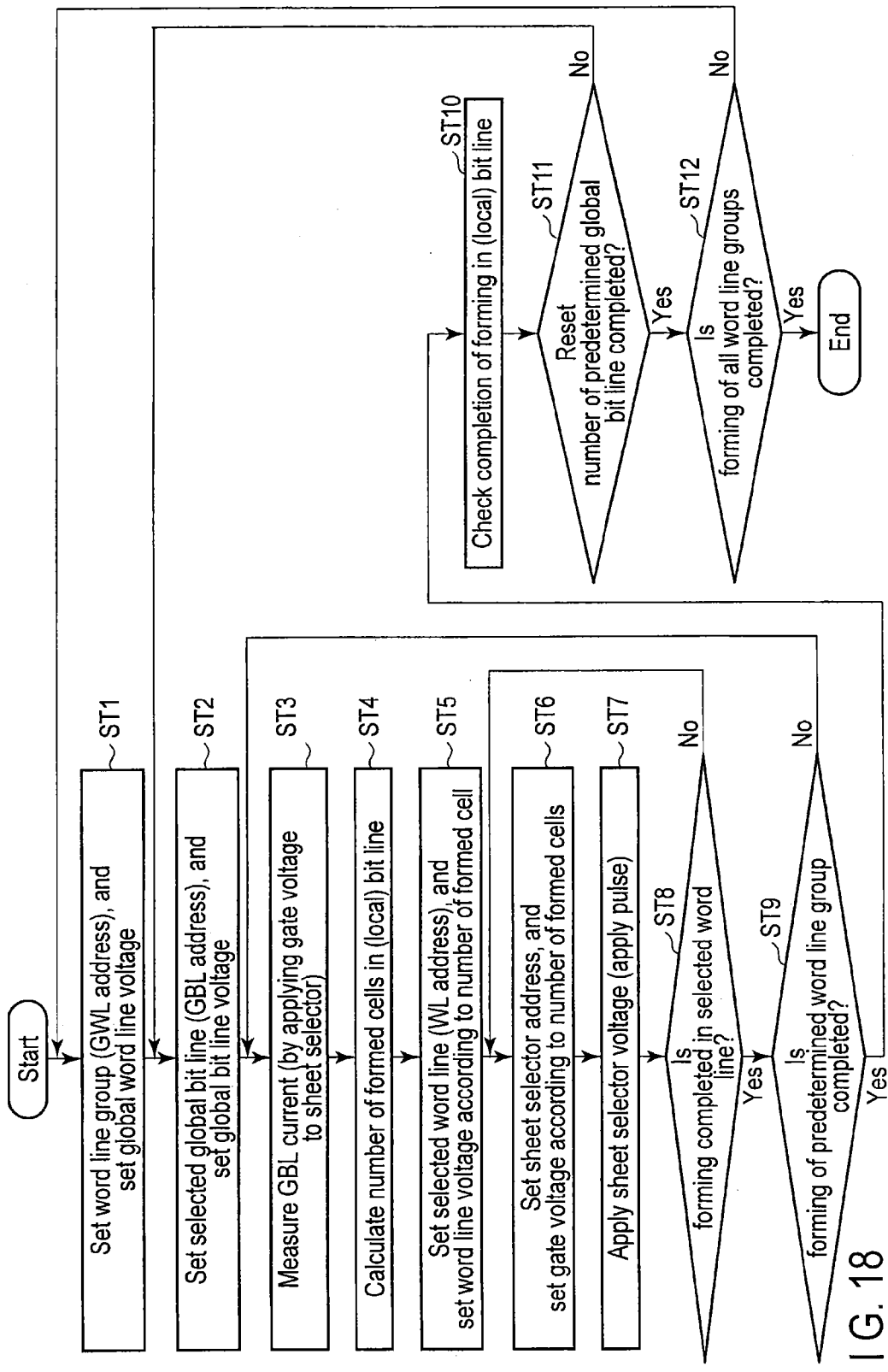
F I G. 18

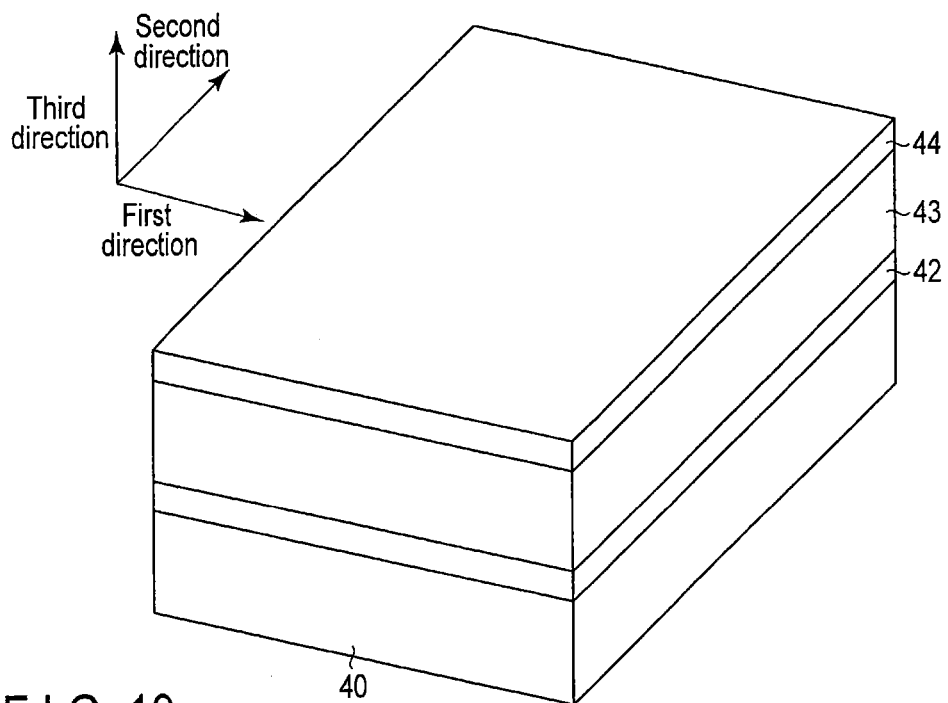
F I G. 19
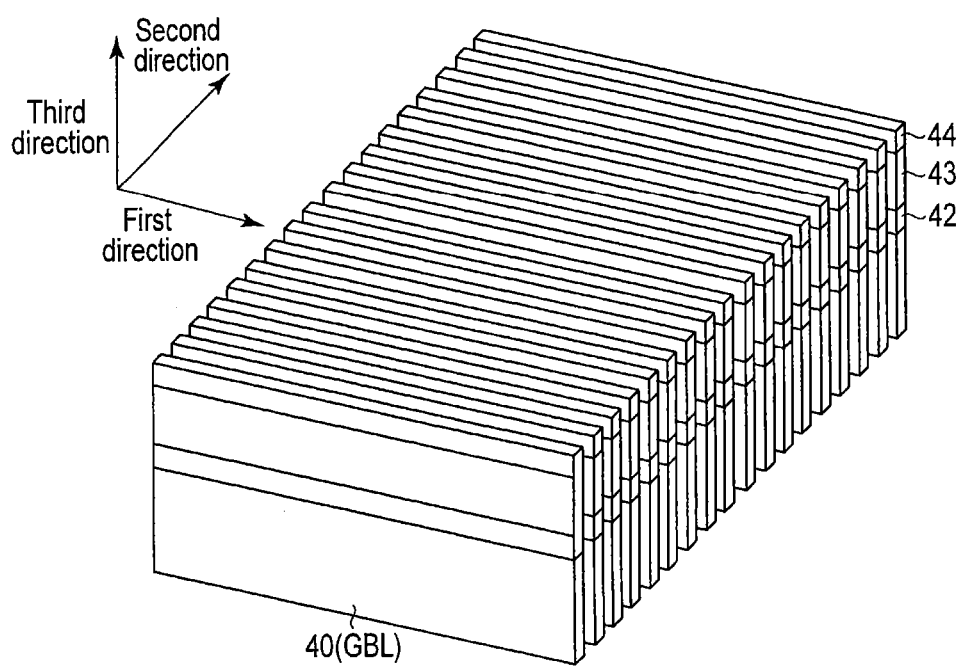
F I G. 20

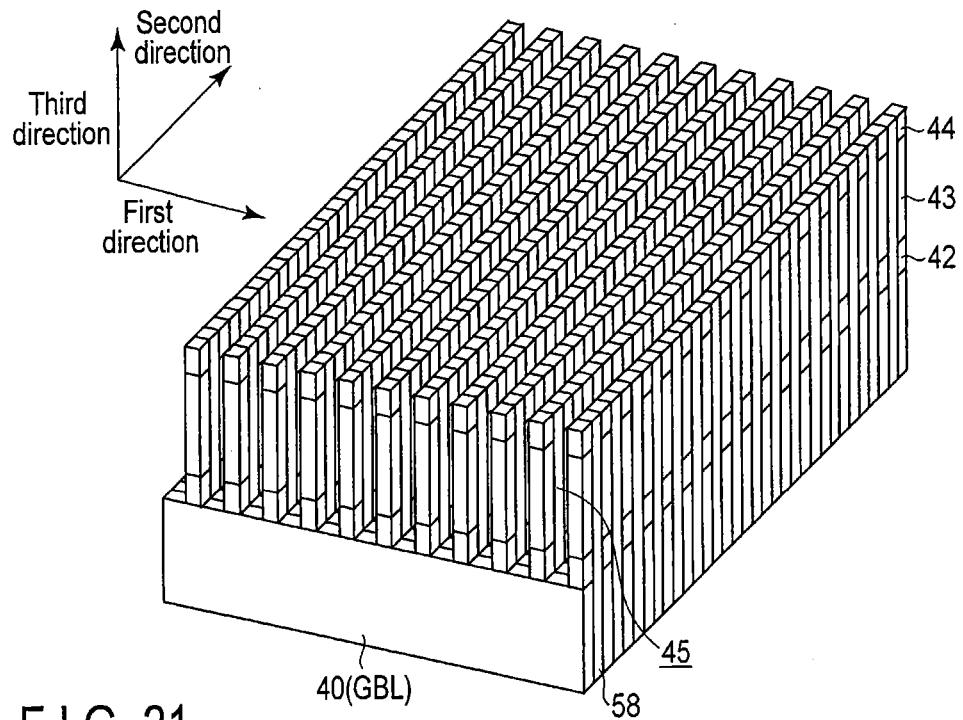
F I G. 21
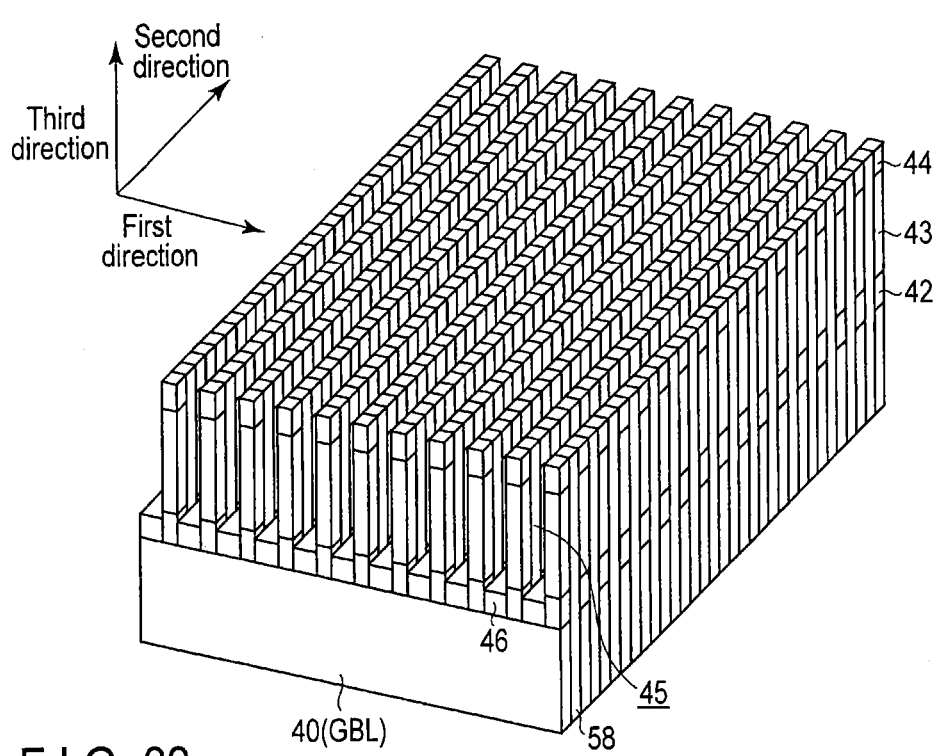
F I G. 22

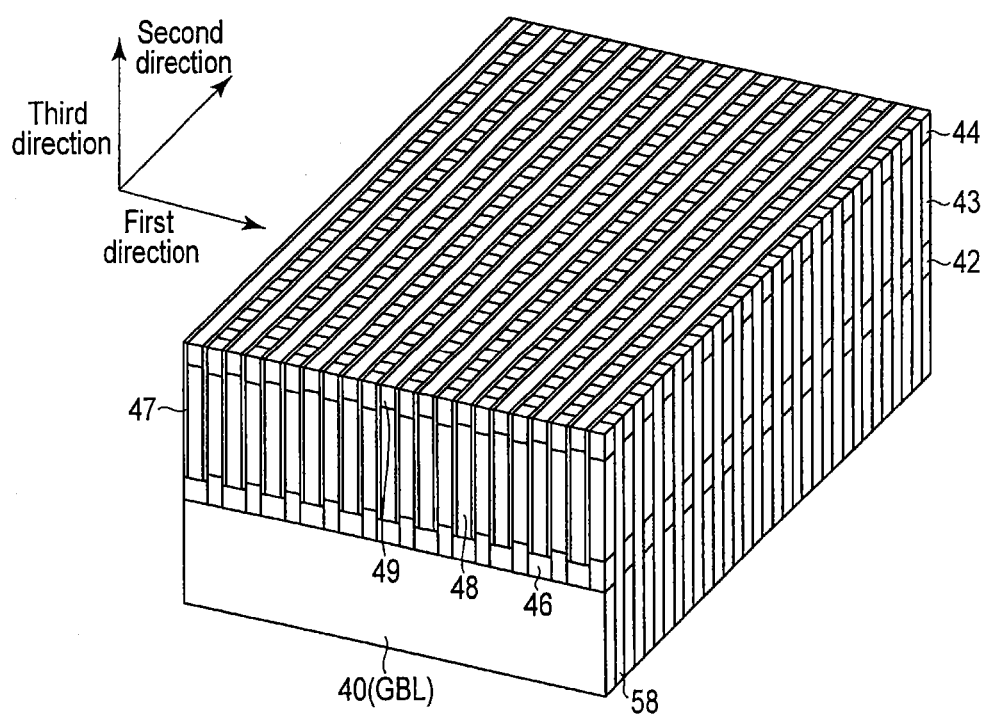
F I G. 25

MEMORY DEVICE AND METHOD OF INITIALIZING MEMORY DEVICE

CROSS-REFERENCE TO RELATED APPLICATIONS

This application claims the benefit of U.S. Provisional Application No. 61/822,583, filed May 13, 2013, the entire contents of which are incorporated herein by reference.

FIELD

Embodiments described herein relate generally to a memory device and a method of initializing a memory device.

BACKGROUND

Recently, there has been proposed a memory, called a resistive RAM (ReRAM) including a resistance change material. It is expected that high integration beyond a conventional trend will be possible. Before the resistive RAM is used by a user, a forming operation needs to be performed depended on the resistance change material.

BRIEF DESCRIPTION OF THE DRAWINGS

FIG. 1 is an example of a perspective view of a memory cell array;

FIG. 4 is an example of a block diagram of a storage device;

FIG. 5 is an example of a circuit diagram of the memory cell array;

FIG. 9 is an example of a diagram illustrating a potential relationship at the time of a forming;

FIG. 10 is an example of a diagram illustrating an equivalent circuit of a configuration of FIG. 9;

FIG. 11 is an example of a diagram illustrating an example of a load curve of a select element of FIG. 10;

FIG. 13 is an example of a diagram illustrating a relationship between the number of finished forming cells and a condition of forming;

FIG. 18 is an example of a flowchart according to a fourth embodiment; and

FIGS. 19 to 30 are examples of perspective views illustrating a manufacturing method.

DETAILED DESCRIPTION

Figure 2:
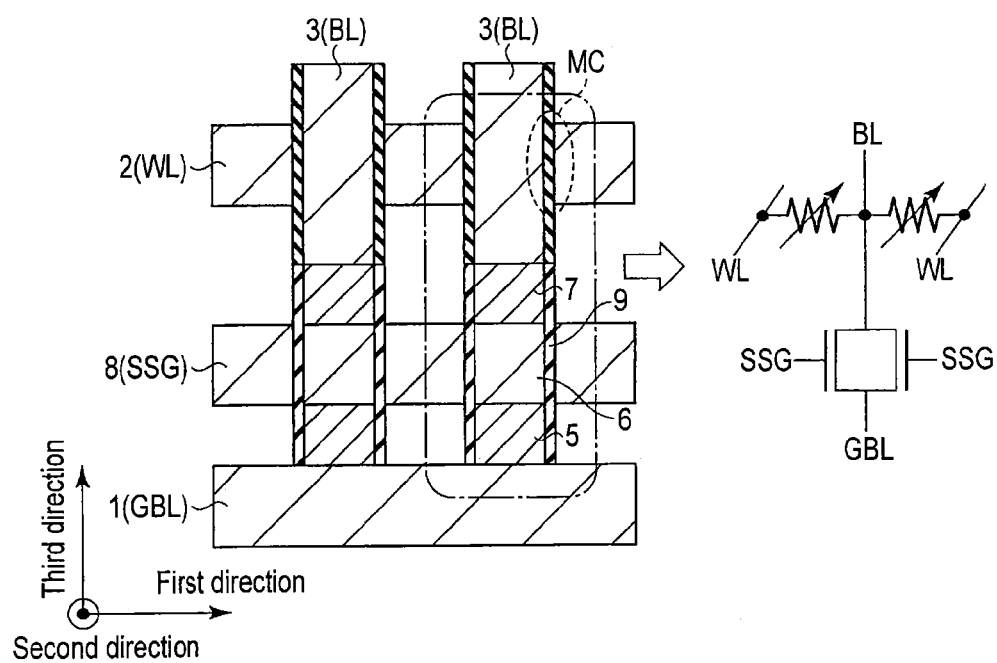
FIG. 2 is a partial cross-sectional view of the memory cell array.

In general, according to one embodiment, a memory device comprising: a first conductive line extending in a first direction; second conductive lines each extending in a second direction intersect with the first direction; a third conductive line extending in a third direction intersect with the first and second directions; resistance change elements connected between the second conductive lines and the third conductive line respectively; a semiconductor layer connected between the first conductive line and one end of the third conductive line; a select FET having a select gate electrode, and using the semiconductor layer as a channel; and a control circuit which is configured to change a condition of initialization of each of non-completed elements in which the initialization is not completed among the resistance change elements based on a number of completed elements in which the initialization is completed among the resistance change elements.

Hereinafter, embodiments will be described with reference to drawings.

1. MEMORY CELL ARRAY

FIG. 1 illustrates an example of a memory cell array.

A plurality of global column lines 1, row lines 2, and column lines 3 is provided within a memory cell array. The global column lines 1 are formed in parallel to each other along a first direction, and, for example, are disposed in the lowermost layer of the memory cell array. The row lines 2 are formed in parallel to each other along a second direction perpendicular to the first direction, and are provided at positions higher than the global column lines 1 in a third direction perpendicular to the first and second directions. Layers of the row lines 2 (first layer, second layer, third layer, ... of FIG. 1) are provided plurally in the third direction (normal direction of a surface on which the global column lines 1 are disposed).

The column lines 3 extend along the third direction between the adjacent row lines 2, and are disposed plurally in the first and second directions. A one end (lower end) of the column line 3 is electrically connected to any one of the global column lines 1. More specifically, in a two-dimensional plane formed in the first direction and the second direction, the column lines 3 disposed on the same column along the first direction are electrically connected to the same global column line 1.

A memory cell MC including a resistance change element is formed between each of the row lines 2 and each of the column lines 3. In the present example, a resistance change material 4 is formed on an entire surface of a side surface of the column line 3 (surface facing the row line 2). A part of the resistance change material 4 disposed between the column line 3 and the row line 2 functions as the memory cell MC.

Also, of the two sets facing side surfaces of the bit line 3, the resistance change material 4 in the present example is provided on two side surfaces facing in the first direction (two side surfaces facing the row line 2), and is not provided on two side surfaces facing in the second direction (two side surfaces not facing the row line 2).

A select element (sheet selector) SS is provided between the global column line 1 and the column line corresponding thereto. The select element SS is, for example, a field effect transistor (FET). Herein, the FET may also be referred to as a "select FET". In this case, the select element SS includes a source region 5 formed on the global column line 1, a semiconductor layer (channel region) 6 formed on the source region 5, and a drain region 7 formed on the semiconductor layer 6. The semiconductor layer 6 is, for example, a silicon layer.

Also, a select gate line (select gate electrode of the select FET) 8 is formed between adjacent semiconductor layers 6 in the second direction. The select gate line 8 is disposed in parallel to the row line 2. Moreover, a gate insulating layer 9 is formed between the select gate line 8 and the semiconductor layer 6.

Also, hereinafter, as in the general MOS memory device, the global column line 1, the row line 2, and the column line 3 may also be referred to as a global bit line GBL, a word line WL, and a bit line BL, respectively.

FIG. 2 illustrates an example of a partial cross-sectional view and an equivalent circuit of the memory cell array.

FIG. 2 is a partial cross-section of the inside of the plane formed in the first direction and the third direction of FIG. 1. As illustrated, the source region 5, the channel region 6, and the drain region 7 are sequentially stacked on the global bit line GBL to form the select element SS. The gate insulating layer 9 is formed on a side surface of the stacked structure.

The select gate line 8 (SSG) is provided between adjacent channel regions 6 in the second direction. A select FET (for example, MOS transistor), which is the select element SS, is formed by the source region 5, the channel region 6, the drain region 7, the gate insulating layer 9, and the select gate line 8 (SSG).

That is, the select element SS has two gates connected to different select gate lines SSG with respect to a set of the source region 5, the channel region 6, and the drain region 7. In other words, two select FETs are provided per a bit line BL. The select FETs share the source region 5, the channel region 6, and the drain region 7, and the gates are connected to different select gate lines SSG. Also, the select elements SS connected to different bit lines BL and adjacent in the first direction share the gate (select gate line SSG) with each other.

A pillar-shaped bit line BL is formed on the drain region 7 of each of the select elements SS. A resistance change material 4 functioning as a memory cell MC is formed on a side surface of the bit line BL. Moreover, a word line WL is formed in a region between the bit lines BL adjacent in the first direction. The resistance change material 4 is formed using, for example, HfO, so as to be in contact with the bit line BL and the word line WL.

The resistance change material 4, which is represented by HfO, is a material that transitions between at least two resistance values: a low resistance state (LRS) and a high resistance state (HRS). It is known that a resistance change material of a high resistance state transitions to a low resistance state when a voltage of a predetermined level or higher is applied thereto, and a resistance change material of a low resistance state transitions to a high resistance state when more than a predetermined amount of a current flows therethrough.

In particular, an element, in which a transition from a high resistance state to a low resistance state and a transition from a low resistance state to a high resistance state are performed by application of voltages with different polarities, is called a bipolar operation element. The resistance change material 4 performing such an operation can be provided with a thin film that is made of at least one of materials including $TiO_2$, $ZnMn_2O_4$, NiO, $SrZrO_3$, $Pr_{0.7}Ca_{0.3}MnO_3$, and carbon, in addition to HfO.

By the above manner, the memory cell MC including the resistance change material 4 provided between the word line WL and the bit line BL is disposed within the memory cell array, for example, in a three-dimensional matrix form. In the present structure, the word line WL and the bit line BL are just line-and-space patterns. The word line WL and the bit line BL have only to intersect with each other in a positional relationship, and it is unnecessary to consider a misalignment in a word line direction and a bit line direction.

Therefore, it is possible to loosen alignment accuracy in the memory cell during manufacture. This makes it possible to easily perform the manufacture. This structure is a highly integrated structure that can store 1-bit information in a $2F^2$ region.

Figure 3:
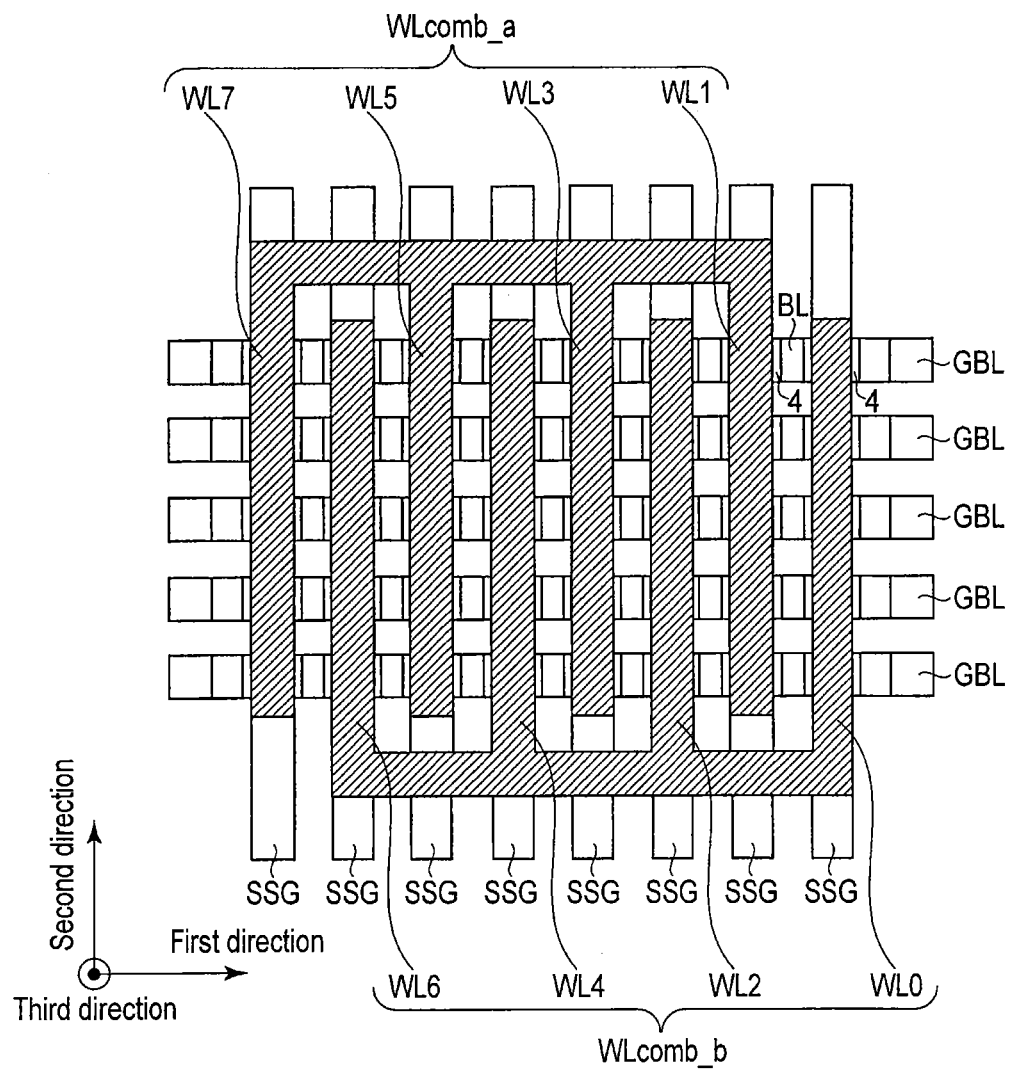
FIG. 3 is an example of a top view of the memory cell array.

FIG. 3 illustrates an example of a top view of the memory cell array.

FIG. 3 is a layout of the inside of the plane formed in the first direction and the second direction of FIG. 1, and in particular, a diagram for describing a plane pattern of the word line WL.

That is, FIG. 3 illustrates a pattern of a word line WL within any one of a plurality of layers of FIG. 1. In FIG. 3, a shaded region represents a layout of the word line WL.

As illustrated, the word line WL in one layer is commonly connected with every other line. In other words, the memory cell array includes two sets of word lines WL each having the comb-shaped structure, and regions of the word lines WL on a straight line along the second direction alternately belong to any one of the comb-shaped structures.

Furthermore, the present configuration can also be rephrased as follows.

When the word lines WL are labeled with WL0, WL1, WL2, ... WL7 in order from the right side of the paper plane of FIG. 3, an electrically equal voltage is applied to odd word lines WL1, WL3, ... WL7 (or these are commonly connected). On the other hand, an electrically equal voltage is also applied to even word lines WL0, WL2, ... WL6 (or these are commonly connected). Different voltages may be applied between the odd word lines and the even word lines (or the odd word lines and the even word lines are separated from each other).

Hereinafter, the set of the odd word lines will be referred to as a word line comb WLcomb_a, and the set of the even word lines will be referred to as a word line comb WLcomb_b. Also, in the case of not distinguishing between both sides, the two combs will be simply referred to as word line comb WLcomb.

Also, although FIG. 3 illustrates the case of including eight word lines, five global bit lines GBL, and forty-five bit lines BL, this is merely exemplary, and the number of these conductive lines can be appropriately changed.

2. OVERALL CONFIGURATION OF STORAGE DEVICE

FIG. 4 is an example of a block diagram illustrating an overall configuration of a storage device.

The storage device 20 includes a memory cell array 21, a WL decoder 22, a GBL decoder 23, a selector decoder 24, a controller 25, and a power supply 26.

The memory cell array 21 has the configuration described with reference to FIGS. 1 and 2. FIG. 5 is an equivalent circuit of the memory cell array 21. As illustrated in FIG. 5, a memory cell MC including a resistance change element (resistance change material 4 of FIGS. 1 and 2) is disposed in the memory cell array 21 in a matrix form. In the memory cell MC, an one end of the resistance change element is connected to any one of the bit lines BL (BL0, BL1, ... ), and the other end of the resistance change element is connected to any one of the word line combs WLcomb (WLcomb_a, WLcomb_b).

Also, in FIG. 5, the word line combs WLcomb_a and WLcomb_b are denoted by WLcomb_ai and WLcomb_bi respectively, but i represents number of a layer where a corresponding word line comb is formed (represents what layer is in order, if the first layer, i=1, if the second layer, i=2, the same hereinafter).

Each of the bit lines BL is connected to the corresponding global bit line GBL through the corresponding select element SS (SS0, SS1, SS2, . . . ). Furthermore, gates of the adjacent select elements SS are connected to a common select gate line SSGj (j is a natural number). The select element SS may be considered as a set of two select FETs TR1 and TR2 connected in parallel and commonly having a source and a drain.

A gate of one of the two select FETs constituting a certain select element SS (for example, TR1) is shared with a gate of one of the two select FETs constituting the adjacent select element SS (for example, TR2).

Also, a gate of the one of the two select FETs constituting the certain select element SS (for example, TR2) is shared with a gate of the other of the two select FETs constituting the adjacent select element SS (for example, TR1).

However, the select element SS disposed at the endmost portion is configured by only one of the transistor TR1 and the transistor TR2.

The three-dimensional stacked memory cell array of FIG. 1 has a plurality of configurations of FIG. 5.

That is, FIG. 5 corresponds to the illustration of the example of the memory cell array MS included in the two-dimensional plane formed in the first direction and the third direction in FIG. 1. The memory cell array MS is disposed plurally along the second direction. In this case, the word line combs WLcomb_ai, the word line combs WLcomb_bi, and the select gate lines SSGj are commonly connected each other between the memory cell arrays MS. On the contrary, the bit lines BL and the global bit lines GBL are separated between the memory cell arrays MS.

Returning to FIG. 4, the description will be continued. The WL decoder 22 includes a word line selection unit and a word line driver. The word line selection unit selects a word line WL, based on a WL address received from the controller 25. The word line driver can apply voltages necessary for reading, writing and erasing data to a selected word line and an unselected word line.

The GBL decoder 23 includes a global bit line selection unit and a global bit line driver. The global bit line selection unit selects a global bit line GBL, based on a column address received from the controller 25. The global bit line driver can apply voltages necessary for reading, writing, and erasing data to a selected global bit line and an unselected global bit line.

The selector decoder 24 includes a selector selection unit and a select gate line driver. The selector selection unit selects a select gate line SSG, based on a sheet address received from the controller 25. The select gate line driver can apply voltages necessary for reading, writing, and erasing data to a selected select gate line and an unselected select gate line.

Also, the "sheet" represents a set of memory cells selected by any one of the select gate lines 8. That is, in FIG. 1, the sheet is a set of memory cells existing in the plane formed in the second direction and the third direction.

The controller 25 controls an overall operation of the storage device 20. Also, the controller 25 can transmit a row address to the WL decoder 22, transmit a column address (GBL address) to the GBL decoder 23, and transmit a selector address to the selector decoder 24.

Also, at the time of writing data, the controller 25 can instruct the WL decoder 22, the GBL decoder 23, and the selector decoder 24 to apply necessary voltages so as to change a resistance state of a resistance change element of a selected memory cell MC.

At the time of reading data, the controller 25 can instruct the WL decoder 22, the GBL decoder 23, and the selector decoder 24 to apply necessary voltages so as to detect a resistance value of a resistance change element of a selected memory cell MC as a storage state of the corresponding memory cell MC.

Moreover, the controller 25 includes a sense amplifier and can sense (amplify) data read in the global bit line GBL by the sense amplifier.

The power supply 26 generates predetermined voltages necessary for reading, writing, and erasing data. The voltages generated by the power supply 26 are applied to the word line WL and the bit line BL.

For example, when writing data, a large potential difference is generated between a selected word line and a selected bit line, and a resistance state of a resistance change element is transitioned. Also, when reading data, a potential difference can be generated between a selected word line and a selected bit line in a range where a transition of a resistance state does not occur, and a current flowing through the bit line or the word line can be detected.

Figures 6, 7:
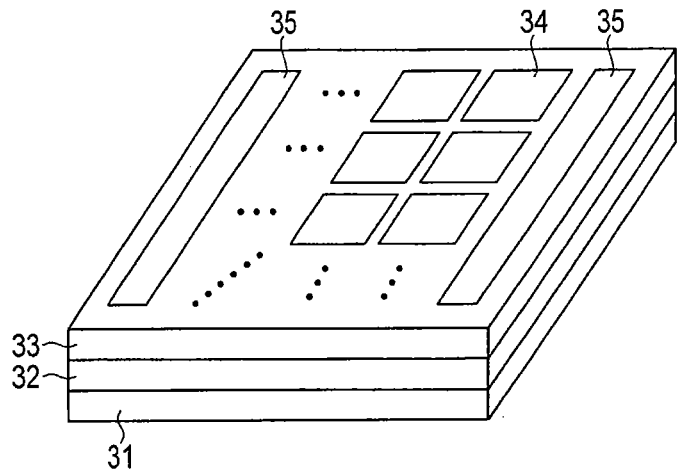
FIG. 6 is an example of an external view of the storage device.
FIG. 7 is an example of a diagram illustrating a bias relationship in an operation of the storage device.

FIG. 6 illustrates an example of an outer appearance of the storage device.

A CMOS circuit 32 including a wire layer is formed on a semiconductor substrate (for example, silicon substrate) 31 by a commonly used process. A layer 33 including a plurality of memory cell units 34 is formed on the CMOS circuit 32. Each of the memory cell units 34 of FIG. 6 corresponds to the memory cell array of FIG. 1, and wires are formed based on, for example, a 20-nm design rule. Also, a portion called a peripheral circuit in a general memory is included in the CMOS circuit 32 of FIG. 6. This portion contains the decoders 22 to 24 and the controller 25 of FIG. 4.

Also, with the exception of the connection portion to the memory cell unit 34, the CMOS circuit 32 can be designed and manufactured based on, for example, a 100-nm design rule, which is looser than the memory cell unit 34. The layer 33 includes an electrical connection portion for the CMOS circuit 32 around each of the memory cell units 34. Blocks based on units of the memory cell unit 34 and the connection portion are disposed in a matrix form.

Furthermore, a through-hole is formed in the layer 33. An input/output unit 35 of the present device, including a terminal electrically connected to an input/output unit of the CMOS circuit 32 through the through-hole, can be formed in, for example, an end portion of the layer 33.

On the other hand, since the memory cell unit 34 and the CMOS circuit 32 are connected in a vertical direction to a substrate surface, an operating time can be reduced or the number of cells capable of being read and written at the same time can be significantly increased, without any increase in a chip area.

Also, a wire drawing pad is formed in the input/output unit 35 of the device and can be bonded to a lead frame in a package process.

3. OPERATION

The operation of the above-mentioned storage device will be described.

Figure 8:
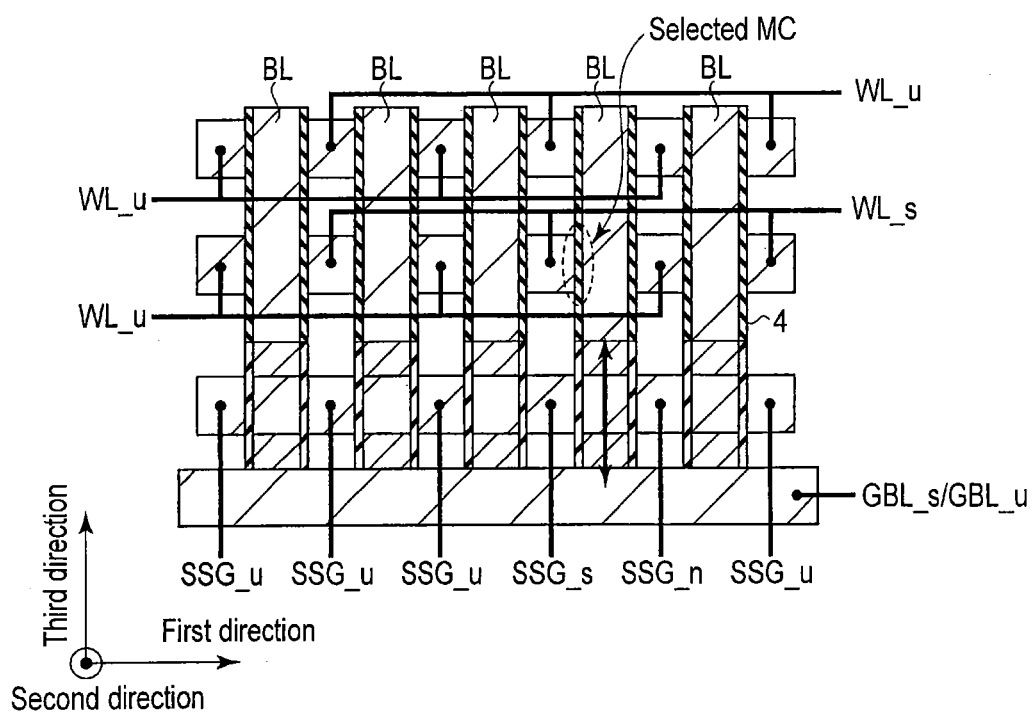
FIG. 8 is an example of a cross-sectional view of the memory cell array.

FIG. 7 illustrates an example of a bias relationship in the operation of the storage device. FIG. 8 is an example of a cross-sectional view of the memory cell array and illustrates the plane formed in the first direction and the third direction in FIG. 1.

In the following description, among global bit lines GBL, a selected global bit line is labeled with GBL_s, and an unselected global bit line is labeled with GBL_u. Also, among word lines WL, a selected word line is labeled with WL_s, and an unselected word line is labeled with WL_u.

Furthermore, among select gate lines SSG, two select elements SS corresponding to a bit line BL, to which a selected memory cell MC is connected, are selected and labeled with SSG_s and SSG_n. The other select gate lines SSG are considered as unselected, and are labeled with SSG_u.

3.1 Set Operation

Next, a write operation of storing information in a memory cell will be described.

In a write operation, the GBL decoder 23 applies a write voltage Vw (>0 V) to the selected global bit line GBL_s, and applies Vwf, for example, a half of the write voltage (Vw/2), to the unselected global bit line GBL_u.

Also, the WL decoder 22 applies 0 V to the selected word line WL_s, and applies Vwf, for example, (Vw/2), to the unselected word line WL_u.

Furthermore, the selector decoder 24 applies a write gate voltage Vg_w (>0 V) to both of the two select gate lines SSG_s and SSG_n, and applies 0 V to the other select gate lines SSG_u.

As a result, in the select element SS connected to the selected bit line BL, a channel is formed by the two select gate lines SSG_s and SSG_n, and the write voltage Vw is transferred from GBL_s to the selected memory cell MC. On the other hand, 0 V is transferred from WL_s to the selected memory cell MC.

Therefore, data is written to the memory cell MC by applying a potential difference of Vw to both terminals of the resistance change element of the memory cell MC.

3.2 Reset Operation

Next, an operation of erasing information retained in the memory cell will be subsequently described with reference to FIGS. 7 and 8.

In an erase operation, considering that the element performs a bipolar operation, the WL decoder 22 applies Ves+Vof, for example, a voltage (Ve+1) obtained by adding an offset voltage Vof (=1 V) to an erase voltage Ve (=Ves), to the selected word line WL_s, and applies Vef+Vof, for example, a voltage ((Ve/2)+1) obtained by adding the offset voltage Vof to a half of the erase voltage Ve (=Vef), to the unselected word line WL_u.

Also, the GBL decoder 23 applies an offset voltage of 1 V to the selected global bit line GBL_s, and applies Vef+Vof, for example, ((Ve/2)+1), to the unselected global bit line GBL_u.

Furthermore, the selector decoder 24 applies an erase gate voltage Vg_e to both of the select gate lines SSG_s and SSG_n, and applies 0 V to the other select gate lines SSG_u.

As a result, as described at the time of the writing, the voltage Ve is transferred to the selected memory cell MC. Data is erased by applying a potential difference of Ve to both terminals of the resistance change element.

Herein, the reason why the offset voltage Vof of about 1 V is input to the global bit line and the word line is as follows: due to characteristics of the select element to be described below, it is possible to significantly reduce a leakage current to the unselected memory cell by setting the potential of the selected global bit line GBL_s to be about 1 V higher than the unselected select gate line SSG_u, and technique for raising the entire voltages of the global bit line and the word line is effective to provide a predetermined potential difference by avoiding a negative voltage circuit, whose required circuit area is relatively large.

3.3 Read Operation

Next, an operation of reading information from the memory cell will be subsequently described with reference to FIGS. 7 and 8.

In a read operation, the GBL decoder 23 applies a voltage (Vr+Vo), which is obtained by adding an offset voltage Vo to a read voltage Vr, to the selected global bit line GBL_s and the unselected global bit line GBL_u.

Also, the WL decoder 22 applies the offset voltage Vo to the selected word line WL_s, and applies (Vr+Vo) to the unselected word line WL_u.

Furthermore, the selector decoder 24 applies a read gate voltage Vg_r to one of the select gate lines SSG_s and SSG_n, applies 0 V to the other, and applies 0 V to the remaining select gate lines SSG_u.

As a result, as described at the time of the writing, the voltage Vr is transferred to the selected memory cell MC through the selected bit line BL. Herein, a current flowing through the selected memory cell MC is different by the resistance state (HRS or LRS) of the selected memory cell MC. For example, data stored in the selected memory cell MC is determined by detecting the current value in the sense amplifier connected to the selected global bit line GBL_s.

Also, generally, for the selected word lines WL_s, only one word line is selected per a memory cell array; however, for the selected global bit lines GBL_s, a plurality of global bit lines may be selected at the same time. Therefore, simultaneously, a bandwidth can be improved due to an increase in the number of bits on which writing, erasing, and reading can be performed.

3.4 Forming Operation (Initialization)

Hereinafter, in initialization processing of the resistance change material, called a forming, technique for changing a condition of forming based on the number of formed resistance change materials or a current flowing through the global bit line will be described.

Also, for example, the condition of the forming can be changed by using the select element (select FET) disposed at the end portion of the bit line as a current limiting element of the resistance change material. In this manner, for example, it is possible to prevent the resistance change material from becoming excessively low resistance.

Herein, the forming (initialization) is processing that enables a resistance value of a resistance change material to transition between a low resistance state and a high resistance state by applying a predetermined voltage or higher to a resistance change material of an initial state.

Generally, the resistance change material before the forming shows a very high resistance value of several hundreds of MΩ as an initial value, but the resistance change material after the forming becomes a resistance value of several tends of MΩ. That is, in the process of the forming, the resistance value of each of the memory cells (resistance change materials) changes more than a single digit.

Therefore, the use of the select element connected in series to the memory cell, which is a target of a forming, as the current limiting element can prevent a current from being rapidly increased in the process of the forming and can prevent the memory cell from being excessively formed. In this manner, a stable driving of the memory cell can be realized.

The forming operation of initializing the resistance value of the memory cell will be described briefly.

In the forming operation, the WL decoder 22 applies Vfs+Vof to the selected word line WL_s, and applies Vff+Vof to the unselected word line WL_u. Herein, for example, Vfs>Vff, and Vof is an offset voltage, for example, 1 V.

Also, the GBL decoder 23 applies, for example, 1 V to the selected global bit line GBL_s as the offset voltage Vof, and applies Vff+Vof to the unselected global bit line GBL_u.

Furthermore, the selector decoder 24 applies Vg1_f to the select gate line SSG_s, applies Vg2_f to the select gate line SSG_n, and applies 0 V to the other select gate lines SSG_u.

As a result, a high potential difference is applied to the selected memory cell MC, and the forming operation of the selected memory cell MC is performed.

Also, the reason why the offset voltage Vof of about 1 V is input to the global bit line and the word line is as follows: due to characteristics of the select element to be described below, it is possible to improve cutoff characteristic of the select element SS connected to the unselected select gate line SSG_u by setting the potential of the selected global bit line GBL_s to about 1 V higher than the unselected select gate line SSG_u. As a result, it is possible to significantly reduce a leakage current to the unselected memory cell, and technique for raising the entire voltages of the global bit line and the word line is effective to provide a predetermined potential difference by avoiding a negative voltage circuit, whose required circuit area is relatively large.

Herein, since the sum of the currents of the half-selected cells, which flow through the select element, is also greatly changed according to the number of the finished forming cells on each of the bit lines, an operating point of the select element fluctuates. Therefore, if the forming of all memory cells is performed in one driving condition, a large distribution occurs in the resistance values of the memory cells after the forming.

A variation in the resistance values makes it difficult for the resistance value of the memory cell to change within a predetermined margin, for example, when transitioning between a low resistance state and a high resistance state.

This aspect will be described in detail with reference to the drawings.

FIG. 9 illustrates an example of the select element, the bit line, and the memory cell (selected cell), FIG. 10 illustrates an example of an equivalent circuit diagram of FIG. 9, and FIG. 11 illustrates an example of a load curve of the select element corresponding to the equivalent circuit diagram of FIG. 10.

FIG. 9 is an example in which thirty-two memory cells MC are connected to one bit line BL. Herein, the forming operation is performed on one memory cell MC1 at a time. Herein, FIG. 11 is a result of electrical properties when the select element SS performs the forming operation in sequence on the memory cells MC in the same voltage condition. A vertical axis of FIG. 11 is a value of a current flowing through the bit line BL, and a scale is linear. Also, a horizontal axis is a voltage applied to the selected word line WL_s in the forming operation. Also, a dotted line of FIG. 11 represents a current-voltage characteristic of the select element, and a solid line represents a current-voltage characteristic when the memory cell is set as a load. Herein, an intersection of the solid line and the dotted line is a current flowing through each of the formed memory cells after an actual forming.

For example, assuming the gate voltage of the select element is constant Vg1=Vg2=A regardless of the number of the finished forming cells, the followings will happen. When the second memory cell is formed in a state in which only one memory cell MC is formed in one bit line BL, the select element performs the forming in the same voltage condition (Vg1=Vg2=A) as the thirty-second memory cell MC. Then, as illustrated in FIG. 11, the current flowing through the second cell at the time of the forming becomes about seven times larger after the forming of the second memory cell MC than that of the second memory cell MC before the forming.

Also, when thirty-one memory cells has been already formed in the bit line and the last thirty-second cell is to be formed in the same voltage condition, the contribution of the current of the unselected memory cell (current of the memory cell of the half-selected state in which a voltage of Vff+1 V is applied to the word line WL_u) is large. Therefore, it is highly likely that it will be difficult to apply a voltage necessary for the forming to the thirty-second cell. Also, at the same time, it is difficult to maintain a current change (increase in the current) within an appropriate range comparing before and after the forming.

Therefore, in the following embodiment, for example, at the time of a forming, a working memory area as a latch circuit or the like, which stores the number of the finished forming cells on the same bit line, is prepared. At the time of the forming, the number of the finished forming cells is referred to, and a condition of forming such as a gate voltage of a select element or a voltage of a selected word line is set based on the read number of the finished forming cells.

Also, in the process of the forming, prior to application of a forming voltage (even a pulse voltage is possible), the number of the finished forming cells on the bit line can be calculated by measuring a current flowing through the bit line BL or the global bit line GBL, and the condition of the forming such as the gate voltage of the select element or the voltage of the selected word line can be set according to the calculated number of the finished forming cells.

This characteristic is summarized as follows.

For example, the storage device includes a first conductive line extending in a first direction, a second conductive line extending in a second direction intersecting with the first direction, a plurality of third conductive lines extending in a third direction intersecting with the first and second directions, a plurality of resistance change elements connected between the second conductive line and the third conductive lines respectively, a semiconductor layer connected between one end of the third conductive line and the first conductive line, and a select FET using the semiconductor layer as a channel and having a select gate electrode.

A control circuit configures to control one of two following operations.

(1) The control circuit is configured to change a condition of initialization of each of elements (also referred to as "non-completed elements") in which the forming operation (also referred to as "initialization") is not completed among a plurality of resistance change elements based on the number of elements (also referred to as "completed elements") in which the initialization is completed.

In this case, the storage device may further include a storage portion configured to store the number of the completed elements. Also, the storage device may further include a current detection circuit connected to the first conductive line and configured to determine the number of the completed elements based on an output value of the current detection circuit.

(2) The control circuit is configured to change a condition of initialization of each of non-completed elements in which the initialization is not completed among a plurality of resistance change elements based on a detection current flowing through a first conductive line.

In this case, the control circuit may determine the number of completed elements in which the initialization is completed among the resistance change elements based on the detection current, and change the condition of the initialization based on the number of the completed elements.

Also, in both of the above (1) and (2), the control circuit is configured to, in the initialization, set the global bit line (first conductive line) to a first potential, set a selected line connected to the selected cell among the word lines (second conductive lines) to a second potential, set unselected lines except the selected line among the word lines (second conductive lines) to a third potential, and set the select gate electrode to a fourth potential. In this case, each of the first and third potentials is, for example, a fixed value, and each of the second and fourth potentials is, for example, a variable value.

A resistance value of each of the resistance change elements selectively has one of storage values in a normal operation after the initialization, and a resistance value of the selected cell has a value larger than the maximum of the storage values before the initialization.

Figure 15:
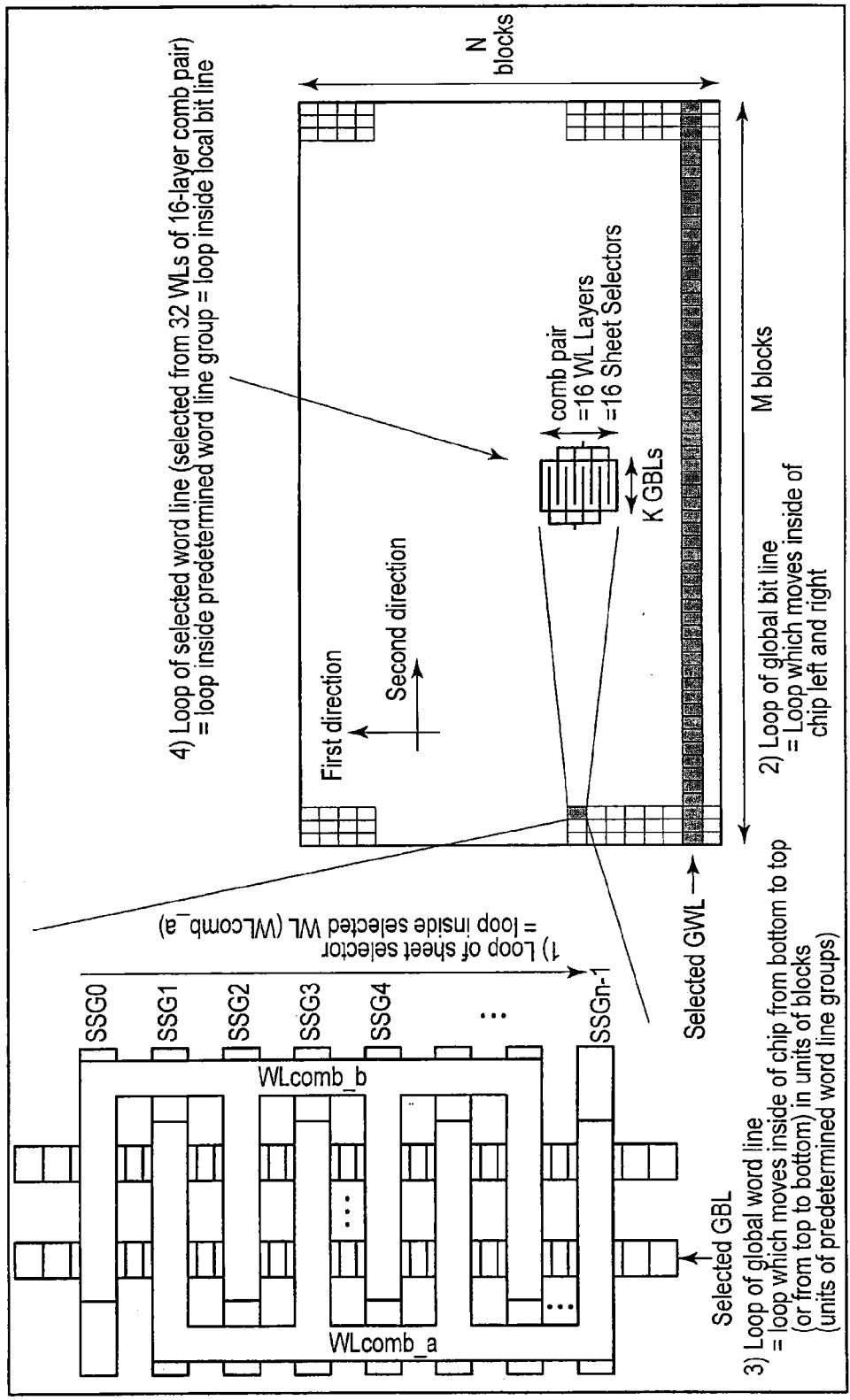
FIG. 15 is an example of a diagram illustrating an example of the processing loop.

FIG. 15 illustrates an example of a forming processing loop. As illustrated in the right diagram of FIG. 15, the memory cell array includes a plurality of blocks. In the example of FIG. 15, N blocks are disposed in the first direction, and M blocks are disposed in the second direction. Also, global bit lines GBL are disposed in the second direction. Herein, one block is configured as illustrated in the middle diagram of FIG. 15. Herein, word lines WL of the blocks arranged in the second direction may be commonly selected by the global word line GWL.

For example, one block includes k global bit lines GBL, and includes word line layers of p layers. Also, each of the word lines of one block includes two word line combs WLcomb. Herein, n memory cells MC are connected to one block, one word line layer, and one global bit line GBL to form n sheet selector (select elements) SS configured to select the memory cells MC respectively. That is, n/2 word lines are disposed in one block and one word line layer.

1) A selection loop of the sheet selector is a loop which selects a sheet selector in a selected word line, for example, a word line comb WLcomb_a (or a word line comb WLcomb_b). Also, 2) a selection loop of the global bit line is a loop which moves (selects) the inside of the memory cell array from left to right (or from right to left) in the second direction in units of blocks (units of predetermined global bit line groups). Also, 3) a selection loop of the global word line is a loop which moves (selects) the inside of the memory cell array from bottom to top (or from top to bottom) in the first direction in units of blocks (units of predetermined word line groups). Furthermore, 4) a selection loop of the selected word line is a loop of a predetermined word line group, that is, a loop which sequentially selects the memory cells in a selected local bit line. For example, the selection loop of the selected word line is a loop which selects thirty-two (=16 layers×2) word lines of sixteen-layer comb pairs.

The order of such loops 1) to 4) may be arbitrary, and one of all twenty-four combinations may be selected. Also, k, N, M, n, and p are positive integers.

5.1 First Embodiment

Figure 12:
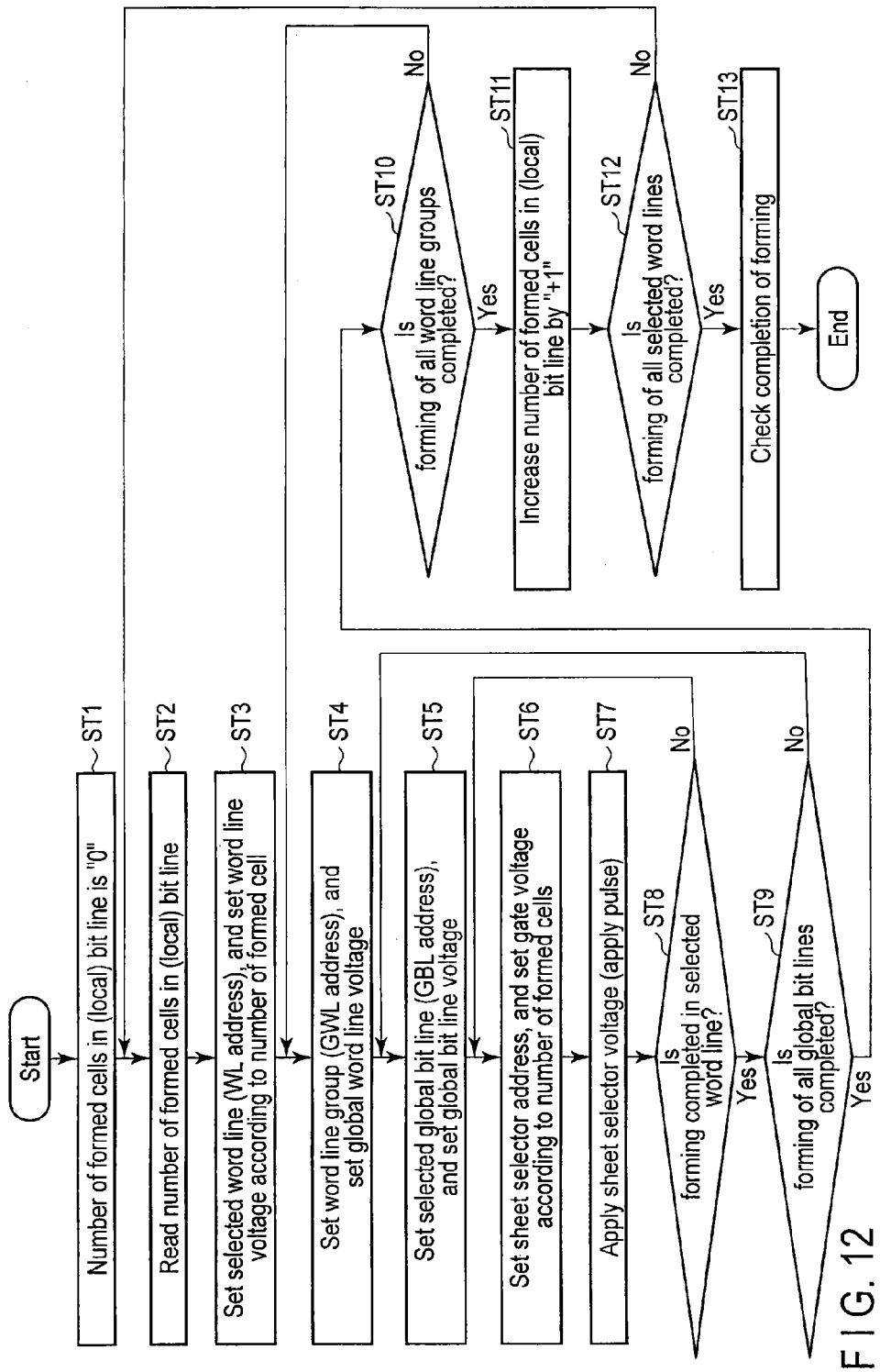
FIG. 12 is an example of a flowchart according to a first embodiment.

FIG. 12 is a flowchart illustrating a forming operation of a storage device according to a first embodiment.

The control circuit 25 sets the number of finished forming cells among a plurality of memory cells connected to a local bit line to "0" (step ST1). The number of the finished forming cells can be stored in a working memory area or the like. Also, the control circuit 25 can previously set all array lines to an unselected potential. Subsequently, the number of the finished forming cells among the memory cells connected to the local bit line is read from the working memory area, and the corresponding condition of the forming is selected (step ST2). Herein, the relationship between the number of the finished forming cells and the condition of the forming, for example, can be stored in a ROM area or the like as a table illustrated in FIG. 13. For example, the relationship of FIG. 13 is previously stored in the ROM area as a look up table (LUT), and then, data read from an LUT is performed in the process of the forming. Also, instead of this, the relationship of FIG. 13 may be stored in the working memory area and data may be read from the working memory area in the process of the forming.

The latter case has an advantage that can easily add a correction value according to a temperature or the like at the time of the forming. Also, data written to the working memory area may be calculated by an operational circuit in the inside of a chip, or may be input as a part of a command set from the outside of the chip.

Subsequently, the control circuit 25 sets a WL address being a selected word line, and sets a voltage of the selected word line selected in step ST2 (step ST3).

Subsequently, the control circuit 25 sets a GWL address which selects a word line group, sets a voltage of an unselected word line, and determines a voltage of the selected global word line selected in step ST2 (step ST4). Also, the control circuit 25 sets a GBL address being the selected global bit line, and sets a voltage of the selected global bit line (step ST5).

Subsequently, the control circuit 25 sets an address of the sheet selector being the gate of the select element SS, and sets each of the gate voltages Vg1 and Vg2 according to the number of the finished forming cells from the table illustrated in FIG. 13 (step ST6). Herein, the control circuit 25 performs the forming operation by applying the selected word line WL_s, the unselected word line WL_u, and the selected global bit line GBL_s, and the gate voltages Vg1 and Vg2 of the select element SS (step ST7).

For example, the above steps are repeated in order of the loop of the sheet selector address in the selected word line, the loop of the selected global bit line address, the loop of the selected global word line (step ST8 and ST9).

Also, in the step in which the loop of all global word lines is completed, the value of the number of the finished forming cells in the memory cells connected to the local bit line increases by "+1" (step ST10 and ST11). The value of the number of the finished forming cells may be stored in the working memory area.

A position of the memory cell to be selected in the local bit line is changed (step ST12). Herein, returning to step ST2, the updated value of the number of the finished forming cells is read from the working memory area. Subsequently, in step ST6, the control circuit 25 sets each of the gate voltages Vg1 and Vg2 from the updated number of the finished forming cells. The control circuit performs the operations of steps ST2 to ST12 until all memory cells connected to the local bit line complete forming. Subsequently, after checking the completion of the forming of all memory cells inside the memory cell array, the forming operation is ended (step ST13).

A specific condition of the forming is illustrated in FIG. 13.

FIG. 13 illustrates an example of a relationship among the number of the finished forming cells in the bit line, Vg1 and Vg2, and Vfs. Vg1 and Vg2 are gate voltages of the select element, and Vfs is a value which determines a cell voltage of a selected cell (memory cell to be carried out forming), that is, "voltage of selected word line—1 V".

Also, Vff, that is, "voltage of unselected word line—1 V", may be commonly 2 V in all cases of FIG. 13.

By setting the condition of forming of each of the selected cells to the relationship illustrated in FIG. 13, the forming voltage is set to a predetermined value or more (for example, 3.0 V or more) in the forming of all memory cells inside the chip, and the change (increase) of the cell current before and after the forming can be controlled within a predetermined range, for example, a range from 1 μA to 3 μA.

Also, the offset of 1 V appearing as the voltage of the word line and the voltage of the global bit line is used to reduce a leakage current of the select element by not making the supply of the gate voltage of the selected element negative and making an effective voltage between a channel and a gate a slight negative voltage. The value is not necessarily 1 V and can be generally expressed as Vof.

Herein, when the number of the finished forming cells is small, the gate voltages Vg1 and Vg2 are set to be small. That is, there is a relationship of A<B and C<D<E. Also, for example, A=2.2 V, B=3.0 V, C=0 V, D=2.2 V, and E=3.0 V are possible. Also, when the number of the finished forming cells is small, the forming voltage also is set to be small. This is because when the number of the finished forming cells is increased, the potential change of the bit line becomes large and thus it is necessary to increase the voltage supplied from the word line WL. Also, the forming voltage can also be changed in relation to the gate voltages Vg1 and Vg2. For example, in the example illustrated in FIG. 13, there is a relationship of a-1<a-2, b-1<b-2 ... b-11, c-1<c-2 ... <c-19. Also, there can be a relationship of a-2>b-1 and b-11>c-1. This is because when the gate voltages Vg1 and Vg2 are increased, the voltage transferred to the bit line is increased and thus there are cases where it is good to lower the forming voltage. Also, for example, a-1=3.0 V, a-2=3.4 V, b-1=3.2 V, b-2=3.3 V, b-3=3.4 V, b-4=b-5=3.5 V, b-6=b-7=3.6 V, b-8=b-9=3.7 V, b-10=B-11=3.8 V, c-1=3.0 V, c-2=3.3 V, c-3=3.6 V, c-4~c-8=3.7 V, c-9~c-17=3.8 V, c-18=c-19=3.8 V are possible.

Also, as illustrated in FIG. 11, there is a tendency that the current flowing through the (local) bit line is increased in a primary forming operation. Therefore, the gate voltages Vg1 and Vg2 may be finely set in the primary forming operation. Also, as indicated by a dotted line of FIG. 11, the flowing current can be greatly changed by making one of the gate voltages Vg1 and Vg2 off. For example, a reliable forming operation can be performed by setting C of FIG. 13 to 0 V.

Herein, by setting A=D and B=E, the operation of the select element SS can be facilitated. In contrast, A≠C when the number of the finished forming cells is "0" or "1". This state may also be referred to as an asymmetric state. In the asymmetric state, the loop (steps ST6 to ST8) of the sheet selector address of FIG. 12 may be performed in the following order.

Figure 14A:
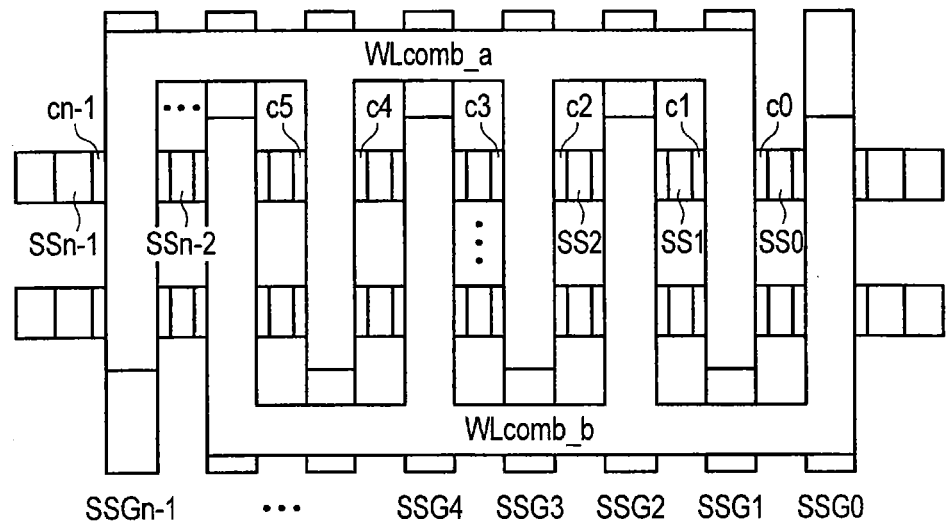
FIGS. 14A and 14B are examples of diagrams illustrating an example of a processing loop within a sheet selector.

Hereinafter, a case where the number of the finished forming cells is "0" will be described as a case where the selection of the word line comb WLcomb_a (forming operation of FIG. 14A) is performed, and a case where the number of the finished forming cells is "1" will be described as a case where the selection of the word line comb WLcomb_b (forming operation of FIG. 14B) is performed. Also, C=0 V, A>0 V, and the voltage applied to the gate electrode of the unselected select element will be described as 0 V. First, as illustrated in FIG. 14A, the control circuit 25 selects a c0 cell by applying a-1 V to the word line comb WLcomb_a, applying Vg1=A V to the select gate line SSG0, applying Vg2=C V (=0 V) to the select gate line SSG1, and applying 0 V to the other select gate lines. As a result, the forming of the c0 cell of FIG. 14A is performed. Herein, the select element SS0 is in a one-side applied state in which a voltage is applied to only the gate electrode of one side (select gate line SSG0). However, the local bit line BL can be selected even in the one-side applied state.

Subsequently, a-1 V is applied to the word line comb WLcomb_a, and the select element SS1 of FIG. 14A is selected. The control circuit 25 applies Vg1=A V to the select gate line SSG1 and applies Vg2=C V (0 V) to the select gate line SSG2. As a result, a forming of a c1 cell of FIG. 14A is performed (the other gate voltages are, for example, 0 V). Herein, the local bit line BL, to which the c0 cell is connected, is also selected. However, since the forming operation to the c0 cell is already finished (the c0 cell is in low resistance state), the resistance state of the c0 cell does not change.

Hereinafter, in a similar manner, the select element SSk of FIG. 14A is selected (where k is an integer from 1 to n−1). The control circuit 25 applies a-1 V to the word line comb WLcomb_a, applies Vg1=A V to the select gate line SSGk, and applies C V (0 V) to the select gate line SSk+1. As a result, a forming of a ck cell of FIG. 14A is performed (for example, the gate voltages of the other select elements SS is 0 V). This operation is repeated until the forming of the memory cells connected to one selected word line comb WLcomb_a is completed. That is, this operation is repeated until k=n−1.

In this manner, the forming of the memory cell connected to each of the local bit lines is completed one by one. That is, the number of the finished forming cells is in a state of "1" (step ST11).

Figure 14B:
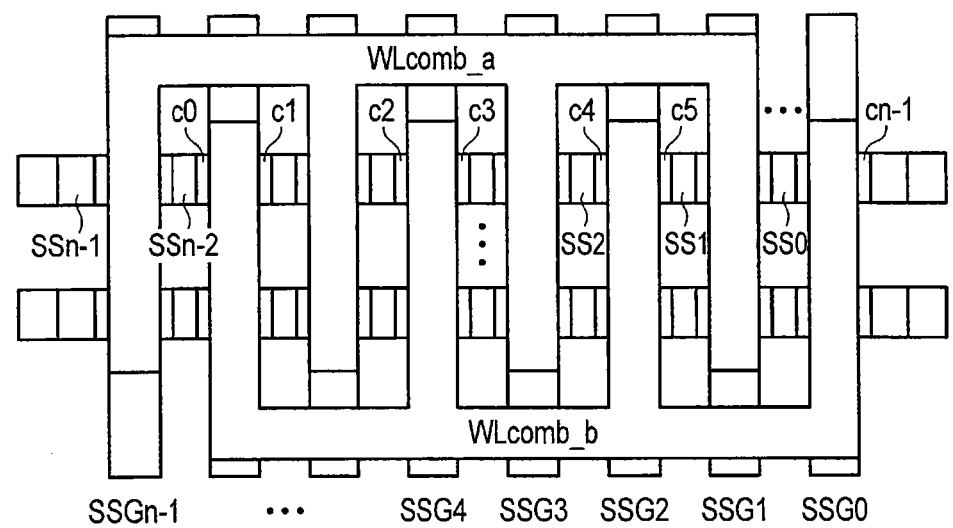

Continuously, the forming is performed by replacing the word line comb WLcomb_a of FIG. 14A and the word line comb WLcomb_b of FIG. 14B. That is, as illustrated in FIG. 14B, the control circuit 25 selects the c0 cell by applying a-2 V to the word line comb WLcomb_b, applying Vg1=A V to the select gate line SSGn−1, applying Vg2=C V (=0 V) to the select gate line SSGn−2, and applying 0 V to the other select gate lines. As a result, the forming of the c0 cell of FIG. 14B is performed. Herein, the select element SSn−2 is in a one-side applied state in which a voltage is applied to only the gate electrode of one side (select gate line SSGn−1). However, the bit line BL can be selected even in the one-side applied state.

Subsequently, a-2 V is applied to the word line group WLcomb_b, and the select element SSn−3 of FIG. 14B is selected. The control circuit 25 applies Vg1=A V to the select gate line SSGn−2 and applies Vg2=C V (0 V) to the select gate line SSGn−3. As a result, the forming of the c1 cell of FIG. 14C is performed (the other gate voltages are, for example, 0 V). Herein, the local bit line BL, to which the c0 cell is connected, is also selected. However, since the forming operation to the c0 cell is already finished (the c0 cell is in low resistance state), the resistance state of the c0 cell does not change.

Hereinafter, in a similar manner, the select element SSn−k−1 of FIG. 14B is selected (where k is an integer from 1 to n−1). The control circuit 25 applies a-2 V to the word line comb WLcomb_b, applies Vg1=A V to the select gate line SSGk+1, and applies C V (0 V) to the select gate line SSk. As a result, a forming of a ck cell of FIG. 14C is performed (for example, the gate voltages of the other select elements SS is 0 V). This operation is repeated until the forming of the memory cells connected to one selected word line comb WLcomb_b is completed. That is, this operation is repeated until k=n−1.

In this manner, two cells complete forming on each of the local bit lines of FIG. 14B, that is, the number of the finished forming cells becomes "2".

This is because, as opposed to the other cases, an asymmetric condition of Vg1≠Vg2 is provided only when the number of the finished forming cells in the local bit line is "0"

or "1", and therefore, it is difficult to apply a general random cell selection (random access) method.

Also, the order of FIG. 14A and FIG. 14B may be reverse. Also, since the word line comb WLcomb_a or the word line comb WLcomb_b is electrically equivalent to each other, the two word line combs WLcomb_a and WLcomb_b need not be word lines of the same layer (height), need not be the same set, and have only to be different word lines each belonging to the same (local) bit line.

5.2 Second Embodiment

Figure 16:
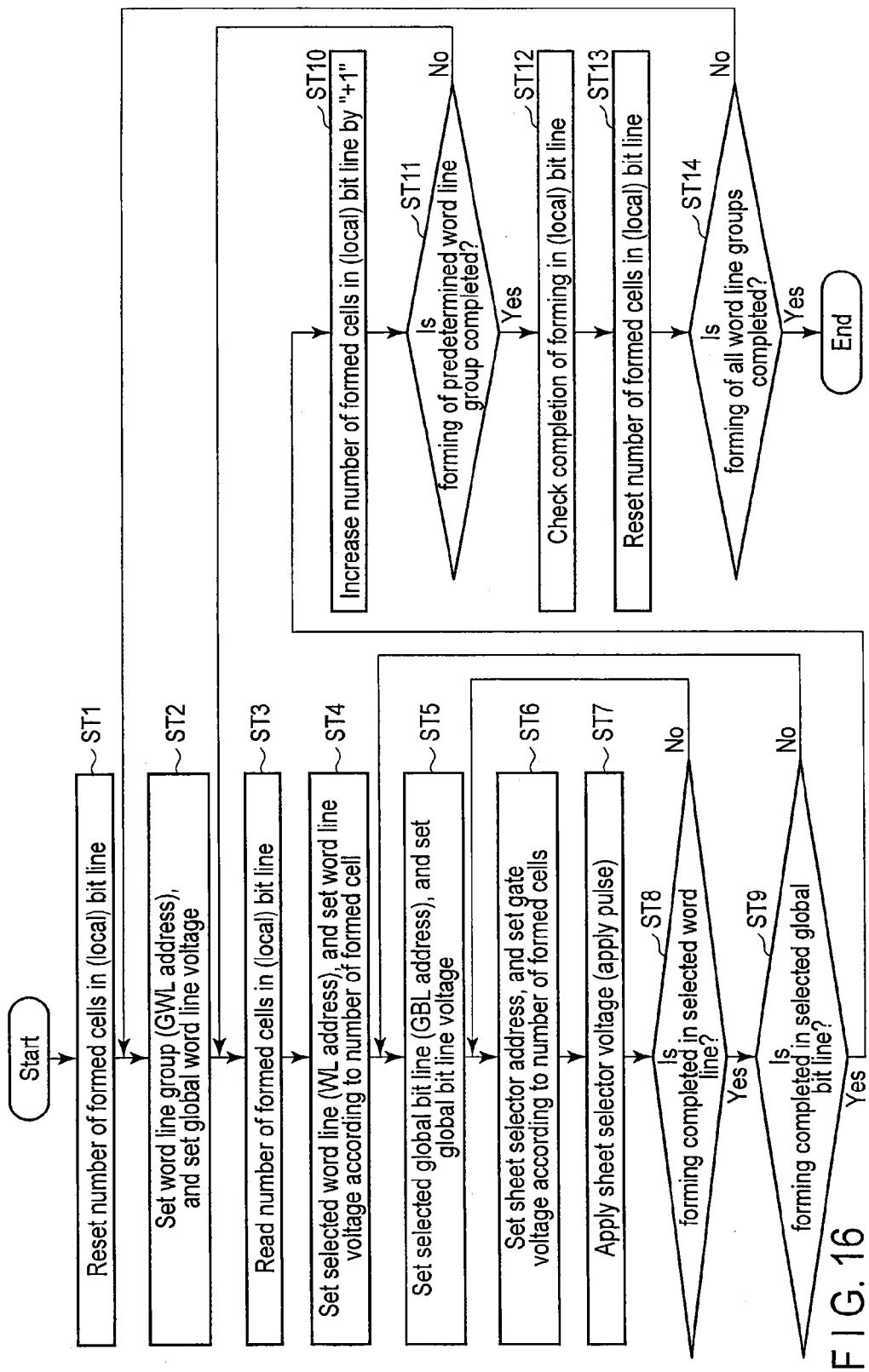
FIG. 16 is an example of a flowchart according to a second embodiment.

FIG. 16 is a flowchart illustrating a forming operation of a storage device according to a second embodiment.

The present example is characterized in that the loop of the word line is disposed inside one stage, and the loop of the global word line is disposed at the outmost side. In this case, since the number of the voltage change of the global word line, which is the largest line delay, becomes smallest, the forming time of the entire chip can be reduced.

All array lines are previously set to an unselected potential, and, first, the number of finished forming cells in a bit line is set to "0" (step ST1). Subsequently, a GWL address selecting a word line group is set, and a selected global word line voltage is set (step ST2).

Subsequently, the number of the finished forming cells in the bit line is read, and a condition of forming corresponding thereto is selected (step ST3). A WL address to become a selected word line is set, and a selected word line voltage is set according to the number of the previously finished forming cells (step ST4). Also, a GBL address to become a selected global bit line is set, and a selected global bit line voltage is set (step ST5).

Subsequently, a sheet selector address to become a gate of a select element is set, and a gate voltage is set according to the number of the finished forming cells (step ST6). Also, the forming of the selected cell is performed by applying a voltage of pulse length corresponding to forming time to the sheet selector (step ST7).

For example, the above steps are repeated in order of the loop of the sheet selector address in the selected word line and the loop of the selected global bit line address (steps ST8 and ST9).

After this, a value of the number of the finished forming cells in the bit line increases by +1 (step ST10). When the loop of the selected word line is repeated and a forming of a predetermined word line group is completed, the number of the finished forming cells in the bit line is reset after checking the completion of the forming of bits in the bit line (step ST11 to ST13).

Also, the loop of the selected global word line is repeated, and the forming operation is ended when a forming of bits inside all word line groups is completed (step ST14).

Also, since specific condition of forming and processing loop of forming have been described in the first embodiment with reference to explanatory diagrams of FIGS. 13, 14A, 14B and 15, a description thereof will be omitted.

5.3 Third Embodiment

Figure 17:
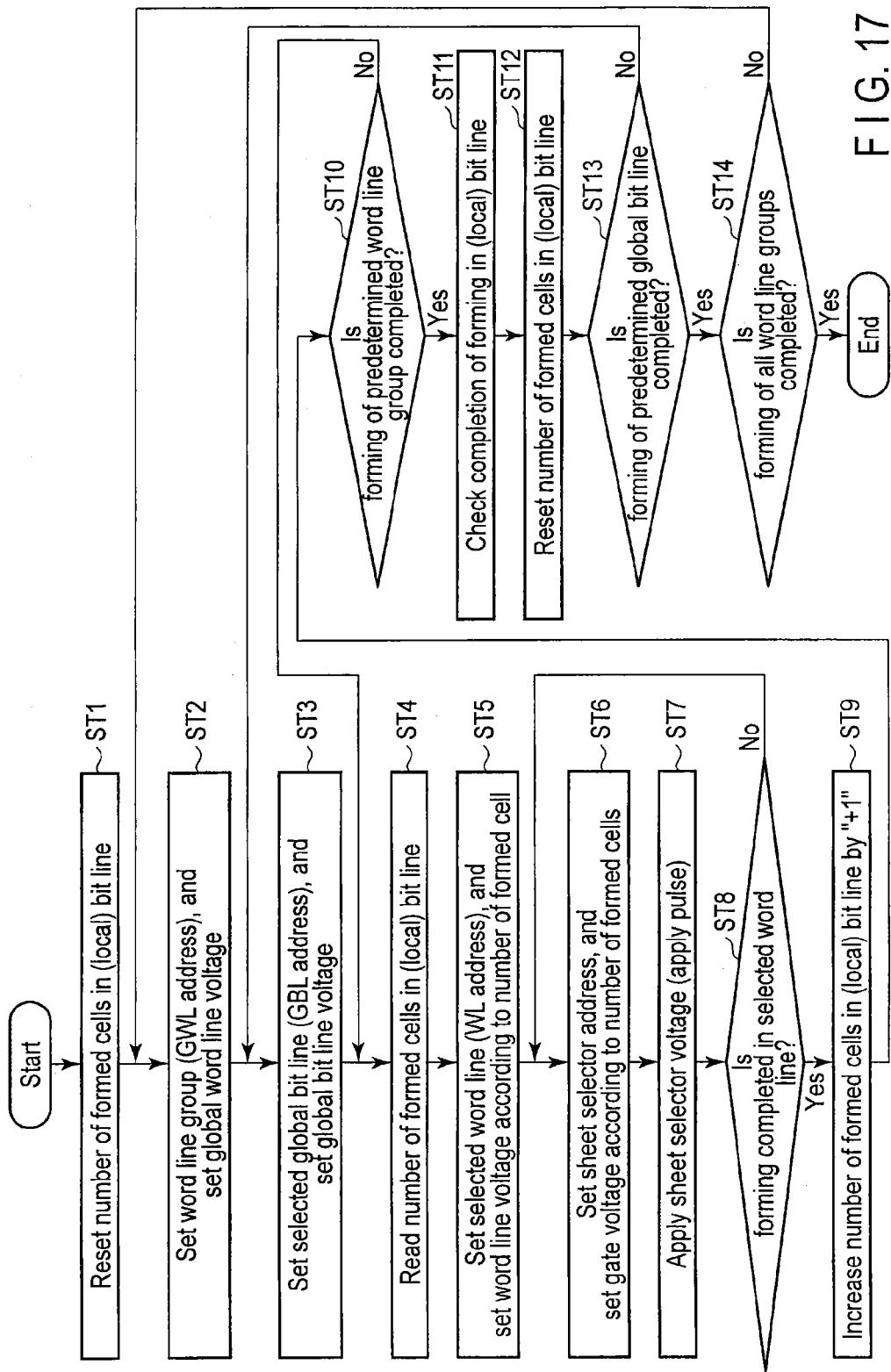
FIG. 17 is an example of a flowchart according to a third embodiment.

FIG. 17 is a flowchart illustrating a forming operation of a storage device according to a third embodiment.

The present example is characterized in that the loop of the word line is disposed inside the loop of the global bit line. In this case, since the number of the voltage change of the global bit line, which is the largest line delay next to the global word line, can be reduced, the forming time of the entire chip can be reduced.

All array lines are previously set to an unselected potential, and, first, the number of finished forming cells in a bit line is set to "0" (step ST1). Subsequently, a GWL address selecting a word line group is set, and a selected global word line voltage is set (step ST2). Also, a GBL address to become a selected global bit line is set, and a selected global bit line voltage is set (step ST3).

Subsequently, the number of the finished forming cells in the bit line is read, and a condition of forming corresponding thereto is selected (step ST4). A WL address to become a selected word line is set, and a selected word line voltage is set according to the number of the previously finished forming cells (step ST5).

Subsequently, a sheet selector address to become a gate of a select element is set, and a gate voltage is set according to the number of the finished forming cells (step ST6). Also, the forming of the selected cell is performed by applying a voltage of pulse length corresponding to forming time to the sheet selector (step ST7).

For example, the above steps are repeated with the loop of the sheet selector address in the selected word line (step ST8). Also, a value of the number of the finished forming cells in the bit line increases by +1 (step ST9). When the loop of the selected word line is repeated and a forming of a predetermined word line group is completed, the number of the finished forming cells in the bit line is reset after checking the completion of the forming of bits in the bit line (step ST10 to ST12).

Also, the above steps are repeated in order of the loop of the selected global bit line address and the loop of the selected global word line (steps ST13 and ST14). The forming operation is ended when the forming of all word line groups is completed (step ST14).

Also, since specific condition of forming and processing loop of forming have been described in the first embodiment with reference to explanatory diagrams of FIGS. 13, 14A, 14B and 15, a description thereof will be omitted.

5.4 Fourth Embodiment

FIG. 18 is a flowchart illustrating a forming operation of a storage device according to a fourth embodiment.

The present example is characterized in that, instead of storing the number of the finished forming cells in the bit line, a current flowing through a global bit line is measured, the number of the finished forming cells in each bit line is calculated from the measured value, and a condition of forming such as a gate voltage of a select element or a selected word line voltage is set according to the calculated number of the finished forming cells.

All array lines are previously set to an unselected potential, and, first, a GWL address selecting a word line group is set, and a selected global word line voltage is set (step ST1). Also, a GBL address to become a selected global bit line is set, and a selected global bit line voltage is set (step ST2).

Subsequently, a sheet selector address to become a gate of a select element is set, a read voltage is applied to the sheet selector, and a current flowing through the global bit line at that time is measured (step ST3). Since the measured value is proportional to the number of half-selected finished forming cells in the bit line, for example, the number of the finished forming cells in the bit line shared with forming target cell is calculated from a measured value of a current flowing through the global bit line (step ST4).

The condition of forming is selected based on the number of the finished forming cells.

Also, the condition of forming can be directly selected from the value of the current flowing through the global bit line.

Subsequently, based on the selected condition of forming, a WL address to become a selected word line is set, and a selected word line voltage is set (step ST5). Also, a gate voltage of the sheet selector is set (step ST6).

Subsequently, the forming of the selected cell is performed by applying a voltage of pulse length corresponding to forming time to the sheet selector (step ST7).

For example, the above steps are repeated in order of the loop of the sheet selector address in the selected word line, the loop of the selected word line address, the loop of the selected global bit line address, and the loop of the selected global word line (steps ST8 to ST12).

The forming of all bits in the chip operation is completed after checking the completion of all global word lines (step ST12).

Also, since specific condition of forming and processing loop of forming have been described in the first embodiment with reference to explanatory diagrams of FIGS. 13, 14A, 14B and 15, a description thereof will be omitted.

By using the present example, the operating point of the select element can be set based on the actual measured value. Therefore, even when there exists a cell having a peculiar value, including a defective cell, the condition of forming can be appropriately set.

6. MANUFACTURING METHOD

Next, a method of manufacturing the storage device according to the above-mentioned embodiment will be described.

FIGS. 19 to 30 illustrate each process of the method of manufacturing the storage device.

First, for example, a general CMOS circuit, which controls an operation of a ReRAM, is formed on a silicon substrate. Subsequently, an interlayer insulating layer is formed on the silicon substrate to cover the CMOS circuit. The following manufacturing method relates to a structure over the interlayer insulating layer.

First, as illustrated in FIG. 19, a global bit line film 40 is formed on the interlayer insulating layer. The global bit line film corresponds to the global bit line GBL described with reference to FIG. 1. As an example, the global bit line film 40 is formed using tungsten (W) and a TiN film as a barrier metal.

Subsequently, an n$^+$ type silicon layer 42, a p$^-$ type silicon layer 43, and an n$^+$ type silicon layer 44 are sequentially formed on the global bit line film 40. The silicon layers 42 to 44 correspond to the source region 5, the channel region 6, and the drain region 7, respectively, which have been described with reference to FIG. 1.

The silicon layers 42 and 44 have a dopant concentration of, for example, about $1 \times 10^{20}$ cm$^{-3}$, and a film thickness of, for example, about 40 nm. The silicon layer 43 has a dopant concentration of, for example, about $1 \times 10^{18}$ cm$^{-3}$, and a film thickness of, for example, about 120 nm. Subsequently, an annealing is performed under the condition of, for example, about 750° C. and 60 seconds, to crystallize the silicon layers 42 to 44.

Subsequently, as illustrated in FIG. 20, the silicon layers 42 to 44 and the global bit line film 40 are patterned by a photolithography technique and an RIE technique. In this manner, a global bit line 40 (GBL) having a stripe shape extending in a first direction is formed. Also, a line width and an adjacent spacing of the global bit line GBL are, for example, about 20 nm, a film thickness thereof is, for example, about 150 nm, and a sheet resistance thereof is, for example, about 1.5 ohm.

Subsequently, as illustrated in FIG. 21, an interlayer insulating layer 58 is formed on an entire surface. Subsequently, the interlayer insulating layer 58 is polished by a CMP method or the like, and an upper surface of the silicon layer 44 is exposed. By the present process, a recess portion formed in the process of FIG. 20 is filled with the interlayer insulating layer 58. Also, the silicon layers 42, 43 and 44 and the interlayer insulating layer 58 are patterned in a stripe shape extending a second direction by using a photolithography technique and an RIE technique.

As a result of the present process, the silicon layers 42, 43 and 44 are separated from each select element SS. Also, the patterning process is performed, for example, under the condition that a line width is about 15 nm and an adjacent spacing is about 25 nm (a half pitch is 20 nm). At a bottom of the recess 45 formed by the present process, the global bit line 40 and the interlayer insulating layer 58 are exposed.

Subsequently, as illustrated in FIG. 22, an insulating layer 46 (for example, a silicon oxide film) is formed on an entire surface. Subsequently, the insulating layer 46 is etched backed so that the insulating layer 46 remains only at the bottom of the recess 45. A film thickness of the remaining insulating layer 46 is, for example, about 30 nm. Therefore, a part of the silicon layer 42 and side surfaces of the silicon layers 43 and 44 are exposed in the inside of the recess 45.

Figure 23:
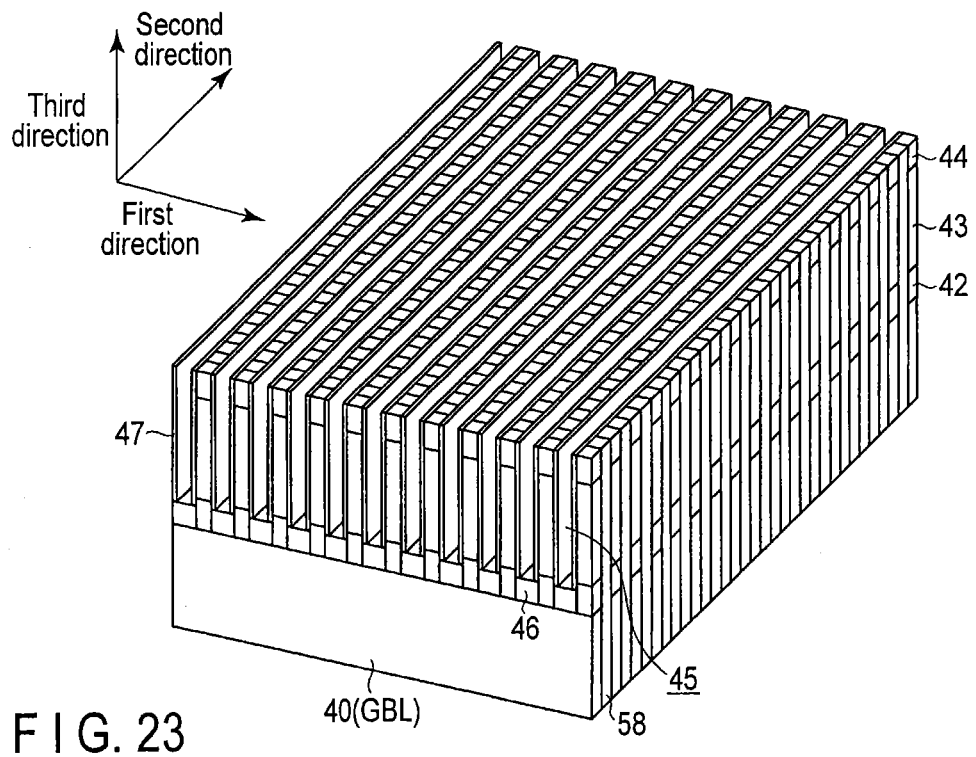

Subsequently, as illustrated in FIG. 23, an insulating layer 47 is formed on an entire surface. The insulating layer 47 corresponds to the gate insulating layer 9 described with reference to FIG. 1. Subsequently, the upper surface of the silicon layer 44 and the insulating layer 47 on the insulating layer 46 are removed so that the insulating layer 47 remains only at the side surface of the recess 45.

Figure 24:
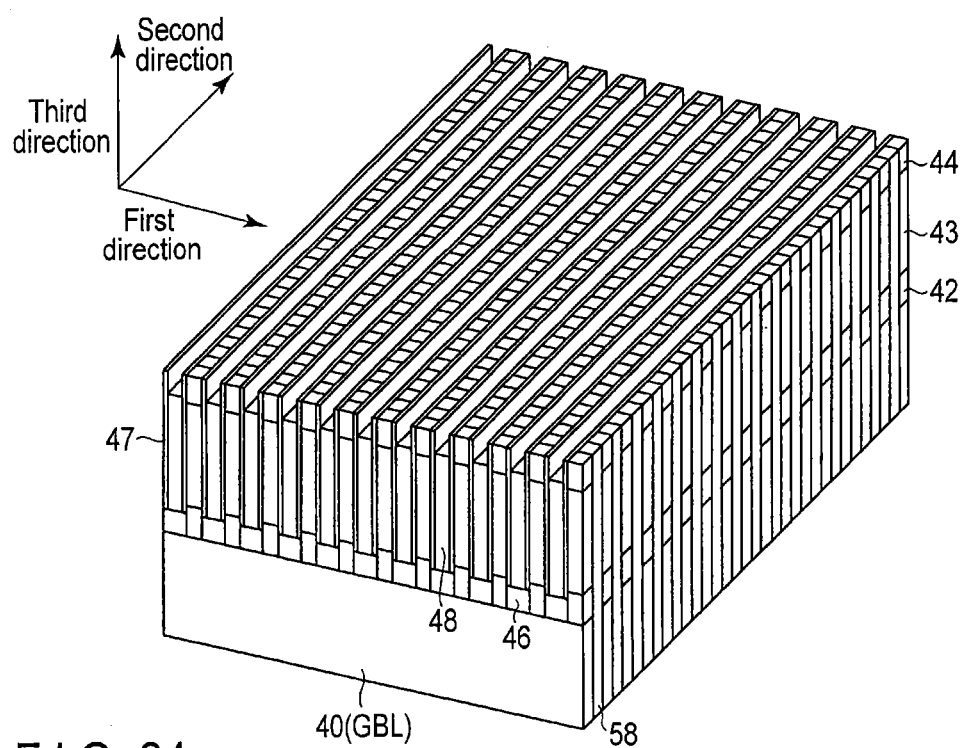

Subsequently, as illustrated in FIG. 24, the inside of the recess 45 is filled with a conductive film 48. The conductive film 48 is, for example, an n$^+$ type polycrystalline silicon layer, and corresponds to the select gate line SSG described with reference to FIG. 1. Subsequently, an upper surface of the conductive film 48 is etched back so that a film thickness of the conductive film 48 becomes, for example, about 140 nm.

By the present process, a lower surface of the conductive film 48 becomes lower than an interface of the silicon layers 42 and 43, and an upper surface of the conductive film 48 becomes higher than an interface of the silicon layers 43 and 44.

Subsequently, as illustrated in FIG. 25, an insulating layer 49 (for example, a silicon oxide film) is formed on an entire surface. Subsequently, the insulating layer 49 is polished by, for example, a CMP method so that the insulating layer 49 remains only within the recess 45. As a result, the upper surface of the silicon layer 44 is exposed.

Figure 26:
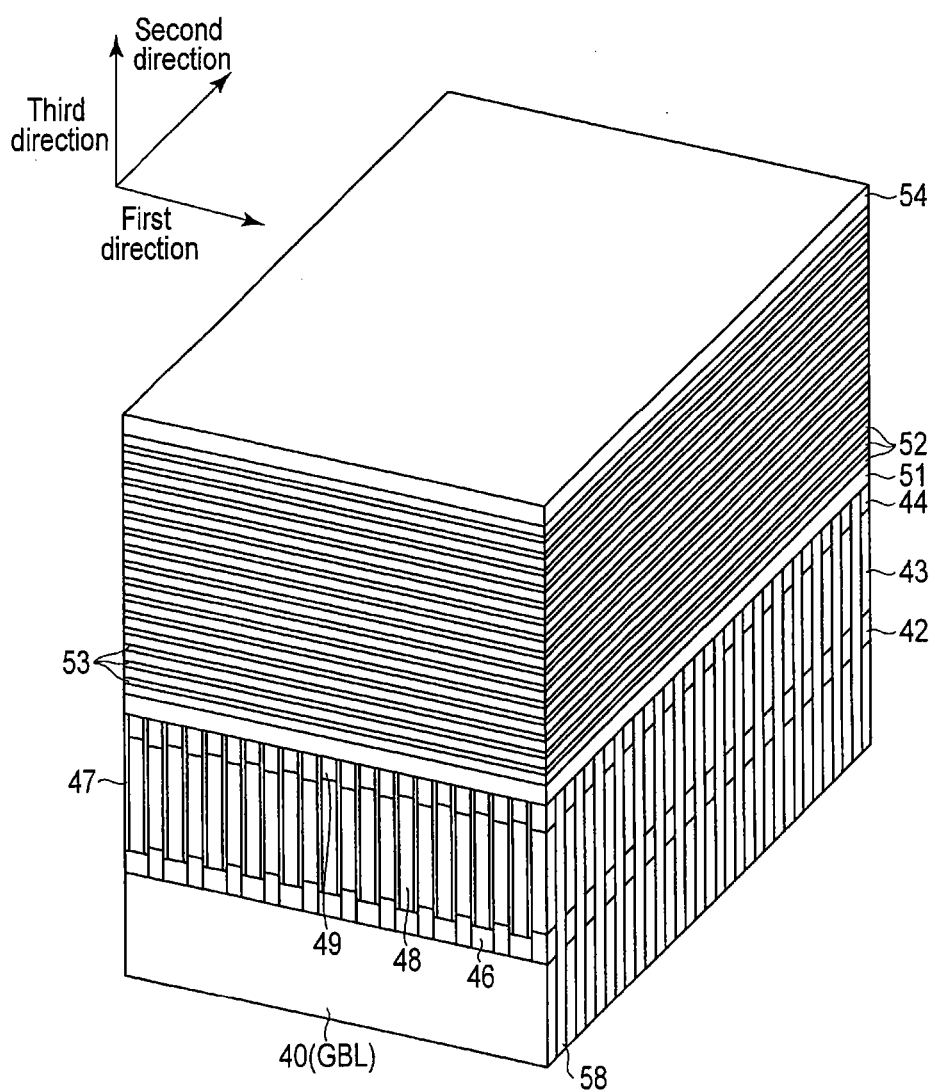

Subsequently, as illustrated in FIG. 26, an insulating layer 51 (for example, a silicon oxide film) having a film thickness of, for example, 20 nm, is formed on the silicon layer 44 and the insulating layers 49 and 58. Subsequently, word line films 52 of sixteen layers are formed on the insulating layer 51. The word line film 52 corresponds to the word line WL described with reference to FIG. 1.

Also, the word line film 52 is formed using, for example, TiN as a material, and a film thickness thereof is, for example, about 10 nm. Also, an insulating layer 53 (for example, silicon oxide film) having a film thickness of, for example, 7 nm is formed between the stacked word line films 52. Subsequently, an insulating layer 54 (for example, silicon oxide film) having a film thickness of, for example, 13 nm is formed on the word line film 52 of the uppermost layer (sixteenth layer in the present example).

Figure 27:
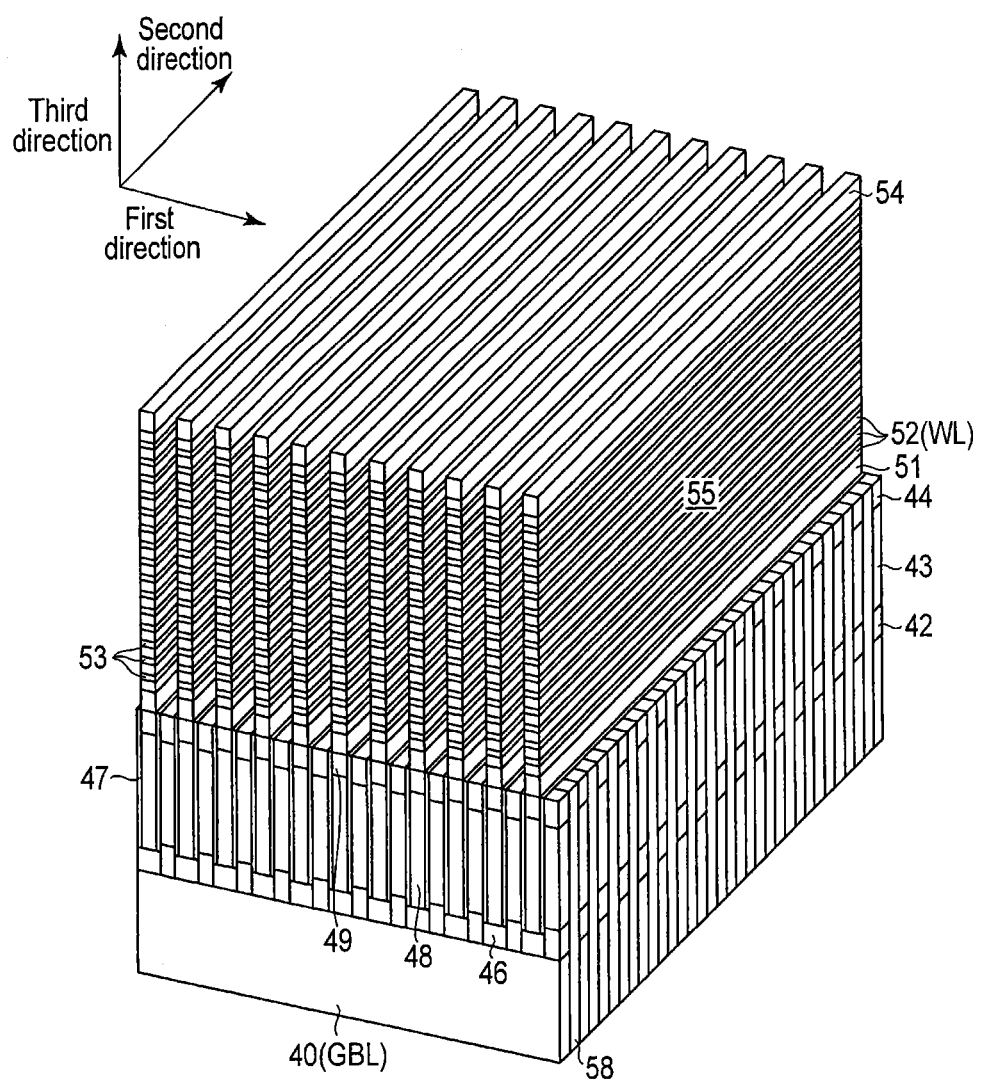

Subsequently, as illustrated in FIG. 27, the insulating layers 54, 53 and 51 and the word line film 52 are patterned in a stripe shape along a second direction by a photolithography technique and an RIE technique. The present patterning process is performed, for example, under the condition that a line width is about 18 nm and an adjacent spacing is about 22 nm (a half pitch is 20 nm).

Also, the present process is performed such that the insulating layers 54, 53 and 51 and the word line film 52 remain on the underlying insulating layer 49. As a result of the present process, the word line WL is formed, and simultaneously, the upper surfaces of the silicon layer 44 and the insulating layers 58 and 47 are exposed at the bottom of the recess 55 formed by the patterning.

Figure 28:
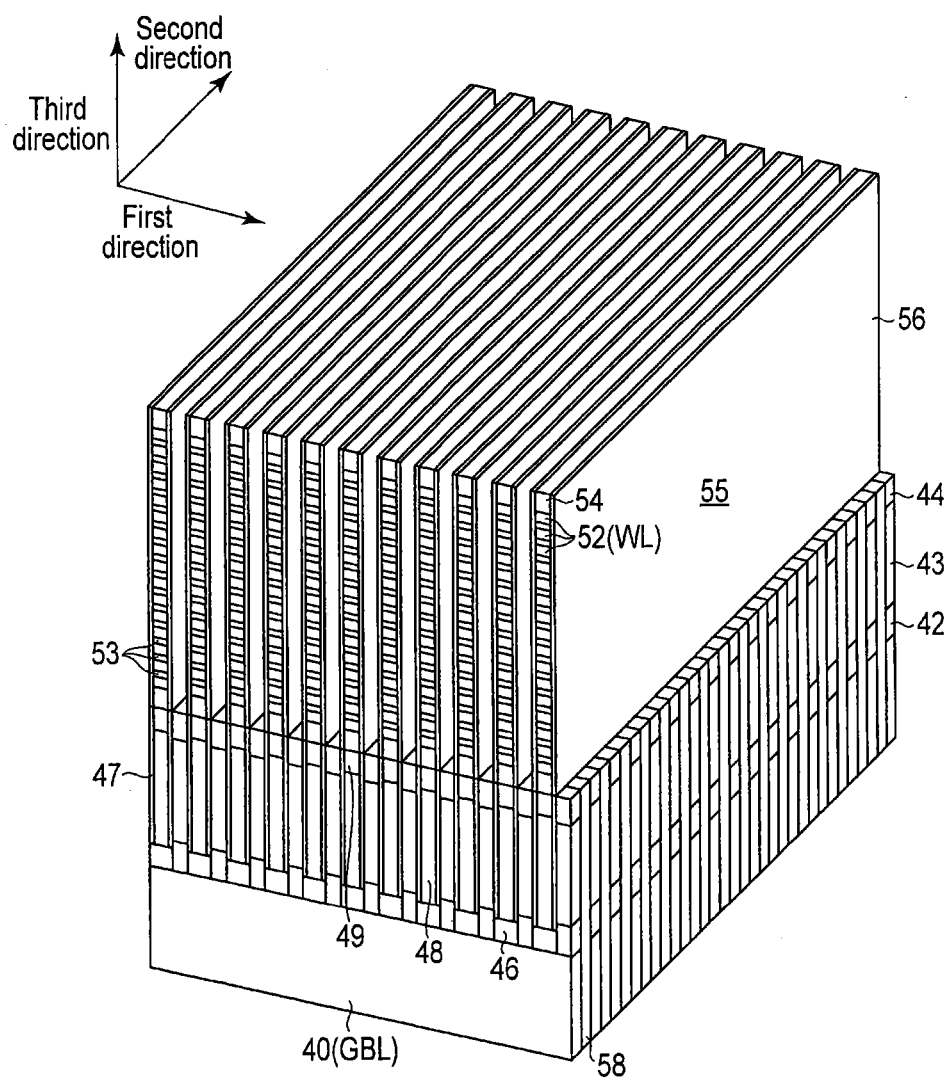

Subsequently, as illustrated in FIG. 28, a resistance change material 56 is formed on the lower surface and side surface of the recess 55 and the upper surface of the insulating layer 54. The resistance change material 56 corresponds to the resistance change material 4 described with reference to FIG. 1. The resistance change material is formed with a film thickness of, for example, about 4 nm, and is formed not to bury the recess 55. Subsequently, an etching-back is performed to remove the resistance change material 56 at the bottom of the recess 55 and on the upper surface of the insulating layer 54. As a result, the upper surfaces of the silicon layer 44 and the insulating layers 58 and 47 are exposed again at the bottom of the recess 55.

Figure 29:
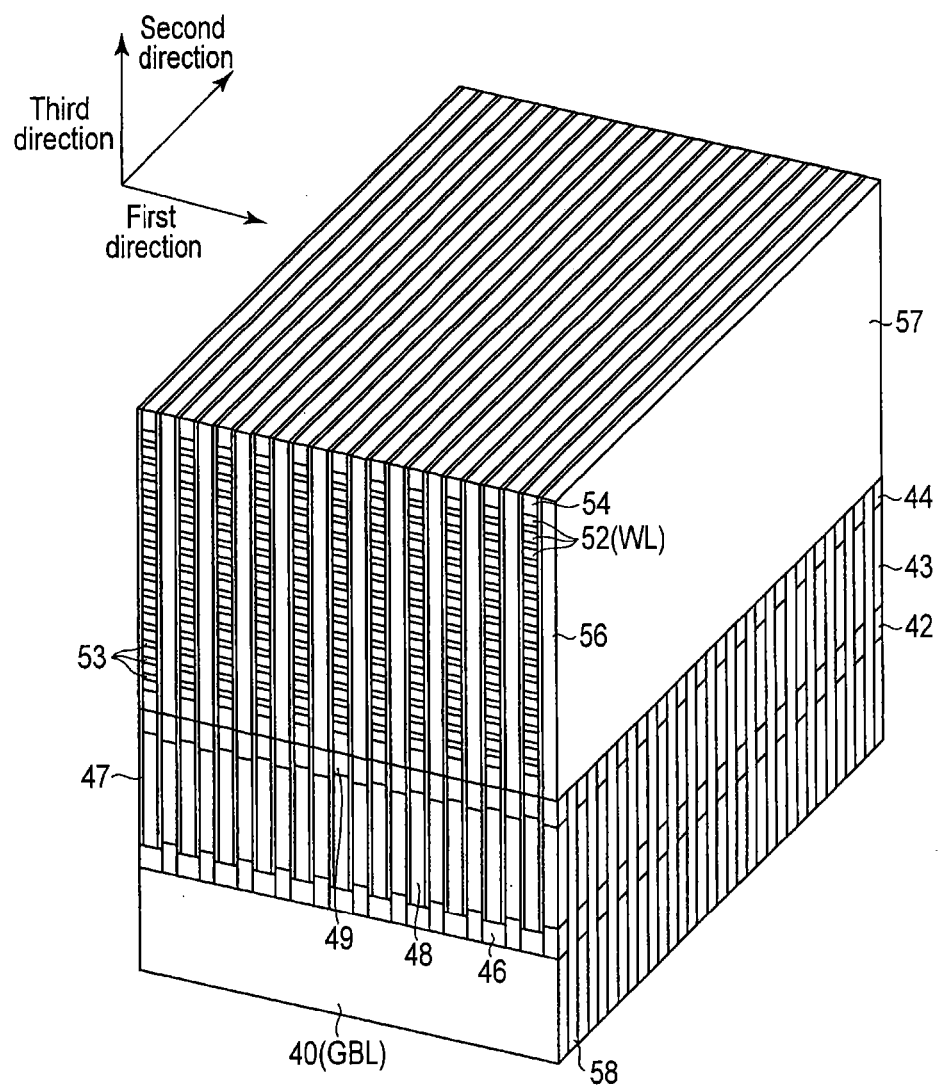

Subsequently, as illustrated in FIG. 29, a bit line film 57 is formed on an entire surface and is polished by a CMP method so that the bit line film 57 remains only within the recess 55. The bit line film 57 corresponds to the bit line BL described with reference to FIG. 1, and is formed using, for example, $n^+$ type polycrystalline silicon as a material.

Figure 30:
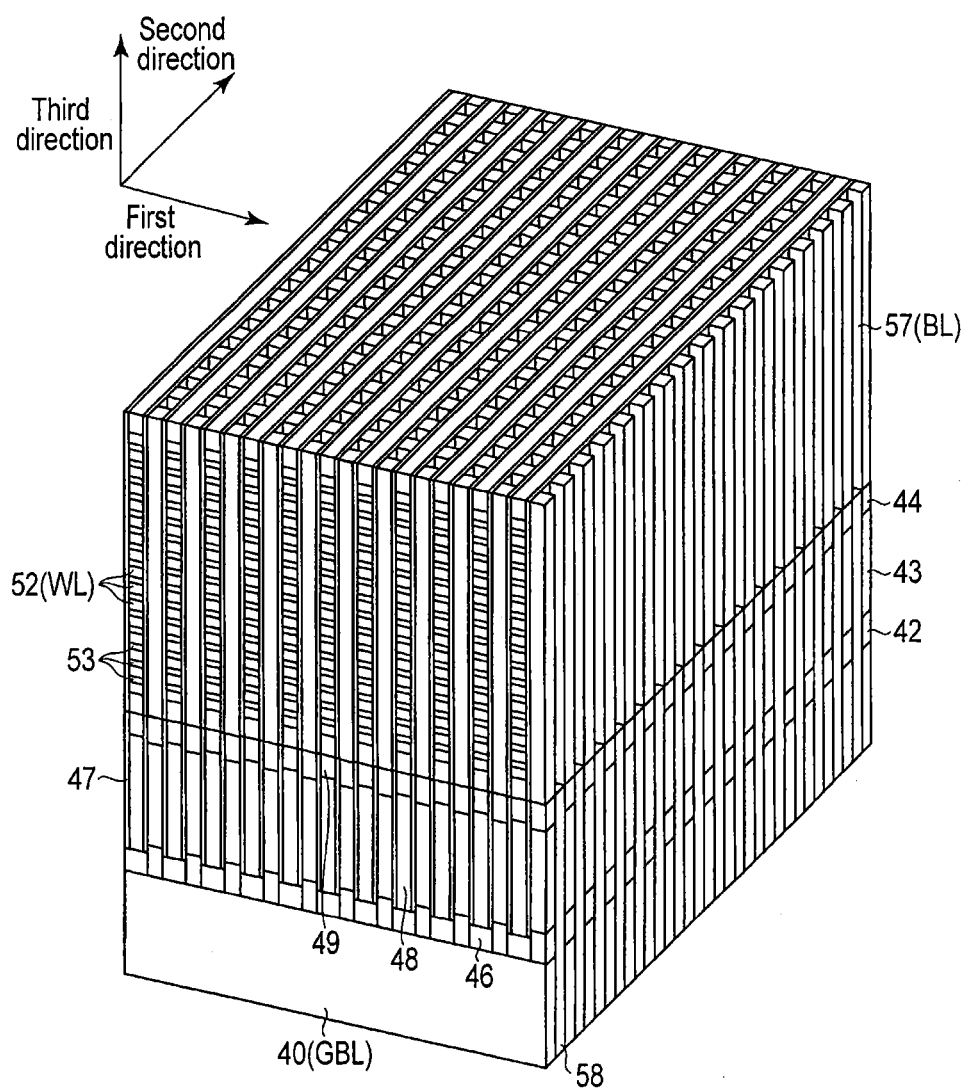

Subsequently, as illustrated in FIG. 30, the bit line film 57 is patterned in a pillar shape by using a photolithography technique and an RIE technique.

The present patterning process is performed, for example, under the condition that a line width and an adjacent spacing are all about 20 nm. Also, the present process is performed such that the bit line film 57 remains on the underlying silicon layer 44. As a result of the present process, a bit line BL is completed.

Subsequently, a recess between adjacent bit lines BL is filled with an interlayer insulating layer, and a memory cell region R1 is completed. Subsequently, as in a typical semiconductor device, a passivation process is performed, and a wire connecting portion, which will be an input/output unit, is further formed. Finally, the above-described storage device is completed by performing a so-called post-process, such as an inspection, a dicing, or the like.

7. CONCLUSION

According to the present embodiment, in the three-dimensional storage device, which is easy to manufacture and can be highly integrated, the forming (initialization) of the memory cell is accurately performed under the optimal condition, achieving high performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a first conductive line extending in a first direction;
second conductive lines each extending in a second direction;
a third conductive line extending in a third direction which intersects with the first and second directions;
resistance change elements connected between the second conductive lines and the third conductive line respectively;
a selector which selects a state of connection between the third conductive line and the first conductive line; and
a control circuit which is configured to change a condition of initialization of each of non-completed elements in which the initialization is not completed among the resistance change elements based on a number of completed elements in which the initialization is completed among the resistance change elements,
wherein a resistance value of each of the resistance change elements selectively has one of storage values in a normal operation after the initialization, and a resistance value of each of the resistance change elements has a value larger than the maximum of the storage values before the initialization.

2. The device of claim 1, further comprising:
a storage portion which stores the number of the completed elements.

3. The device of claim 1, further comprising:
a current detection circuit connected to the first conductive line,
wherein the control circuit is configured to determine the number of the completed elements based on an output value of the current detection circuit.

4. The device of claim 1,
wherein the selector comprises a select FET which comprises: a semiconductor layer connected between the first conductive line and one end of the third conductive line as a channel; and a select gate electrode, and
a voltage applied to the select gate electrode when a number of the completed elements is A, is larger than a voltage applied to the select gate electrode when the number of the completed elements is B, in the initialization, where A>B.

5. The device of claim 4,
wherein the control circuit is configured to:
set the first conductive line to a first potential, set a selected line connected to a selected cell as a target of the initialization among the second conductive lines to a second potential, set unselected lines except the selected line among the second conductive lines to a third potential, and set the select gate electrode to a fourth potential, in the initialization, and
wherein each of the first and third potentials is a fixed value, and each of the second and fourth potentials is a variable value.

6. The device of claim 1,
wherein a voltage applied to the second conductive line when a number of the completed elements is A, is larger than a voltage applied to the second conductive line when the number of the completed elements is B, in the initialization, where A>B.

7. A memory device comprising:
a first conductive line extending in a first direction;
second conductive lines each extending in a second direction;
a third conductive line extending in a third direction which intersects with the first and second directions;
resistance change elements connected between the second conductive lines and the third conductive line respectively;
a selector which selects a state of connection between the third conductive line and the first conductive line; and
a control circuit which is configured to change a condition of initialization of each of non-completed elements in which the initialization is not completed among the resistance change elements based on a current flowing to the first conductive line,
wherein a resistance value of each of the resistance change elements selectively has one of storage values in a normal operation after the initialization, and a resistance value of each of the resistance change elements has a value larger than the maximum of the storage values before the initialization.

8. The device of claim 7,
wherein the control circuit is configured to:
determine a number of completed elements in which the initialization is completed among the resistance change elements based on the current, and
change the condition of the initialization based on the number of the completed elements.

9. The device of claim 7,
wherein the selector comprises a select FET which comprises: a semiconductor layer connected between the first conductive line and one end of the third conductive line as a channel; and a select gate electrode, and
a voltage applied to a selected cell as a target of the initialization among the resistance change elements is equal to or larger than a predetermined value, and a variance of a current flowing to the select FET is within a predetermined range before or after the initialization.

10. The device of claim 9,
wherein the control circuit is configured to:
set the first conductive line to a first potential, set a selected line connected to the selected cell among the second conductive lines to a second potential, set unselected lines except the selected line among the second conductive lines to a third potential, and set the select gate electrode to a fourth potential, in the initialization, and
wherein each of the first and third potentials is a fixed value, and each of the second and fourth potentials is a variable value.

11. A method of initializing a memory device,
the device comprising:
a first conductive line extending in a first direction;
second conductive lines each extending in a second direction;
a third conductive line extending in a third direction which intersects with the first and second directions;
resistance change elements connected between the second conductive lines and the third conductive line respectively; and
a selector which selects a state of connection between the third conductive line and the first conductive line;
the method comprising:
changing a condition of initialization of each of non-completed elements in which the initialization is not completed among the resistance change elements based on a number of completed elements in which the initialization is completed among the resistance change elements,
wherein a resistance value of each of the resistance change elements selectively has one of storage values in a normal operation after the initialization, and a resistance value of each of the resistance change elements has a value larger than the maximum of the storage values before the initialization.

12. The method of claim 11, further comprising:
determining the number of the completed elements based on a current flowing to the first conductive line.

13. The method of claim 11,
wherein the selector comprises a select FET which comprises: a semiconductor layer connected between the first conductive line and one end of the third conductive line as a channel; and a select gate electrode, and
a voltage applied to the select gate electrode when a number of the completed elements is A, is larger than a voltage applied to the select gate electrode when the number of the completed elements is B, in the initialization, where A>B.

14. The method of claim 13, further comprising:
setting the first conductive line to a first potential, setting a selected line connected to a selected cell as a target of the initialization among the second conductive lines to a second potential, setting unselected lines except the selected line among the second conductive lines to a third potential, and setting the select gate electrode to a fourth potential, in the initialization,
wherein each of the first and third potentials is a fixed value, and each of the second and fourth potentials is a variable value.

15. The method of claim 14,
wherein a voltage applied to the second conductive line when a number of the completed elements is A, is larger than a voltage applied to the second conductive line when the number of the completed elements is B, in the initialization, where A>B.

16. A method of initializing a memory device,
the memory device comprising:
a first conductive line extending in a first direction;
second conductive lines each extending in a second direction;
a third conductive line extending in a third direction which intersects with the first and second directions;
resistance change elements connected between the second conductive lines and the third conductive line respectively; and
a selector which selects a state of connection between the third conductive line and the first conductive line;
the method comprising:
changing a condition of initialization of each of non-completed elements in which the initialization is not completed among the resistance change elements based on a current flowing to the first conductive line,
wherein a resistance value of each of the resistance change elements selectively has one of storage values in a normal operation after the initialization, and a resistance value of each of the resistance change elements has a value larger than the maximum of the storage values before the initialization.

17. The method of claim 16, further comprising:
determining a number of completed elements in which the initialization is completed among the resistance change elements based on the current, and
changing the condition of the initialization based on the number of the completed elements.

18. The method of claim 16,
- wherein the selector comprises a select FET which comprises: a semiconductor layer connected between the first conductive line and one end of the third conductive line as a channel; and a select gate electrode, and
- a voltage applied to a selected cell as a target of the initialization among the resistance change elements is equal to or larger than a predetermined value, and a variance of a current flowing to the select FET is within a predetermined range before or after the initialization.

19. The method of claim 18, further comprising:
- setting the first conductive line to a first potential, setting a selected line connected to the selected cell among the second conductive lines to a second potential, setting unselected lines except the selected line among the second conductive lines to a third potential, and setting the select gate electrode to a fourth potential, in the initialization,
- wherein each of the first and third potentials is a fixed value, and each of the second and fourth potentials is a variable value.

* * * * *